United States Patent
Sawada

[11] Patent Number: 5,903,514
[45] Date of Patent: May 11, 1999

[54] MULTI-BANK SYNCHRONOUS SEMICONDUCTOR MEMORY DEVICE

[75] Inventor: Seiji Sawada, Hyogo, Japan

[73] Assignee: Mitsubishi Denki Kabushiki Kaisha, Tokyo, Japan

[21] Appl. No.: 09/041,177

[22] Filed: Mar. 12, 1998

[30] Foreign Application Priority Data

Sep. 2, 1997 [JP] Japan .................................. 9-237302

[51] Int. Cl.⁶ ...................................................... G11C 8/00
[52] U.S. Cl. ................ 365/233; 365/230.03; 365/230.06
[58] Field of Search ............................... 365/233, 230.03, 365/230.06

[56] References Cited

U.S. PATENT DOCUMENTS 5,796,673  8/1998  Foss et al. ............................... 365/233

FOREIGN PATENT DOCUMENTS 6-342595  12/1994  Japan .
8-129887  5/1996  Japan .

Primary Examiner—Andrew Q. Tran
Attorney, Agent, or Firm—McDermott, Will & Emery

[57] ABSTRACT

In a multi-bank semiconductor memory device, if only one bank is in the active state, a bank drive signal generating circuit supplies, operation mode designation signals corresponding to an operation mode instruction signal supplied from a command decoder according to array activation signals from bank driving circuits provided corresponding to banks respectively, to the bank driving circuit provided for the bank in the active state. The state of the bank address signal is arbitrary. Accordingly, control of bank designation in the multi-bank semiconductor memory device is simplified.

11 Claims, 17 Drawing Sheets

MULTI-BANK SYNCHRONOUS SEMICONDUCTOR MEMORY DEVICE

BACKGROUND OF THE INVENTION

1. Field of the Invention

The present invention relates to a semiconductor memory device, and more particularly, relates to a multi-bank semiconductor memory device having a plurality of banks which can be driven into an active/inactive state independently of each other. The invention more specifically relates to a structure for bank control of a synchronous semiconductor memory device which operates in synchronization with a clock signal.

2. Description of the Background Art

A synchronous semiconductor memory device having data input/output synchronously with a clock signal has been known. In the synchronous semiconductor memory device, a clock signal determines the data input/output rate, and data can be transferred according to a high speed clock signal which is a system clock, for example. As a result, necessary data can be provided to a processor operating at a high speed in a short time. The waiting time of the processor is thus reduced and the performance of a processing system is improved.

One such synchronous semiconductor memory device is a synchronous dynamic random access memory (SDRAM). The SDRAM includes a dynamic memory cell of one transistor/one capacitor type as a memory cell. In SDRAM, external signals or a control signal and an address signal as well as write data are taken into the device at, for example, a rising edge of a clock signal, and read data attains a defined state at the rising edge of the clock signal. In the SDRAM, an instruction on an operation mode is supplied as a combination of logic states of a plurality of external control signals. The operation mode instruction is generally referred to as "command". By giving an instruction as to an operation mode in the form of a command, an operation mode instruction can be given every clock cycle, so that a plurality of memory arrays can be internally driven independently of each other. A plurality of banks are generally provided internally in the SDRAM. Concerning 16 M-bit SDRAM, for example, a specification according to which 2 banks are internally provided is standardized by JEDEC (Joint Electron Device Engineering Council).

FIG. 25 shows states of external signals at the time of data reading in a conventional SDRAM.

In clock cycle #0, an external row address strobe signal ZRAS is set to an L level and a column address strobe signal ZCAS and a write enable signal ZWE are set to an H level at a rising edge of an external clock signal extCLK. The state of the signals referred to as an active command designates array activation. "Array activation" is an operation of driving a row in a memory cell array into a selected state and carrying out detection, amplification, and latching for data in a memory cell connected to the selected row by a sense amplifier. When the active command is issued, a row selecting operation is carried out for a bank designated by a bank address signal BA using an address signal ADD concurrently applied as a row address signal X. With two bank structure, bank address signal BA is an 1-bit signal, and bank address signal BA is set to the H level to designate a bank #A in the clock cycle #0. Accordingly, the bank #A is driven into an active state.

In a clock cycle #1, at a rising edge of external clock signal extCLK, row address strobe signal ZRAS and write enable signal ZWE are set to the H level and column address strobe signal ZCAS is set to the L level. This state referred to as a read command designates reading of data. When the read command is given, a column selecting operation is carried out for the bank #A designated by the current bank address signal BA, using address signal ADD concurrently applied as a column address signal, and data in a selected memory cell is read.

A clock cycle period required from the supply of read command to output of valid data in the SDRAM is referred to as CAS latency. Valid data is output when the CAS latency has passed. In FIG. 25, a data reading operation with the CAS latency of 2 is represented. In this case, data in a memory cell addressed by a column address signal Y in the bank #A attains a defined state at a rising edge of clock signal extCLK in a clock cycle #3 (shown as data a0).

In the SDRAM, a column address signal is internally generated according to a prescribed sequence with an address signal at the time of the supply of the read command as a leading address, and a selecting operation for a memory cell is successively carried out according to the internally generated column address signal (burst address signal). Accordingly, data a1, a2, and a3 are successively read from the bank #A in clock cycles #4, #5 and #6.

In parallel with reading of data from bank #A, an active command is supplied in clock cycle #4. At this time, bank address signal BA is set to the L level to designate another bank #B. As a result, in clock cycle #4, bank #B is activated, current address signal ADD is used as a row address signal X, and a row selecting operation is carried out.

In clock cycle #5, bank #B is designated by setting bank address signal BA to the L level again, and a read command is issued. The read command allows a column selecting operation to be carried out for bank #B, and data in a memory cell on a selected column is read out.

As the CAS latency is 2, data is read out in bank #B in clock cycle #6, and memory cell data b0 from bank #B attains a defined state at a rising edge of an external clock signal extCLK in clock cycle #7. A burst address signal is also internally generated in bank #B, memory cells are successively selected and data in a selected memory cell is read. The number of data read out successively when one read command is supplied is referred to as a burst length. FIG. 25 represents a data reading operation when the burst length is 4.

On the other hand, row address strobe signal ZRAS and write enable signal ZWE are set to the L level and column address strobe signal ZCAS is set to the H level to supply a precharge command in clock cycle #6. The precharge command is a command which drives a bank in an active state to an inactive state. The precharge command allows a bank addressed according to bank address signal BA to be precharged. Therefore, bank address signal BA is at the H level at a rising edge of external clock signal extCLK in clock cycle #6, bank #A is designated, and bank #A is inactivated.

In parallel with a reading operation for data b1, b2 and b3 from bank #B, in clock cycle #8, bank address signal BA is set to the H level again to supply an active command to bank #A. Bank #A is thus activated again. Next in clock cycle #9, a read command is supplied for bank #A. Data from bank #A is read after reading of the last data b3 of the burst length data from bank #B (shown as (a) in FIG. 25).

When two banks are provided as described above, the banks are alternately activated/inactivated. Even if different rows (word lines) are accessed, the RAS precharge time in a standard DRAM is unnecessary to achieve a high speed data reading.

FIG. 26 is a timing chart showing states of external signals at the time of data writing. Referring to FIG. 26, a data reading operation is described. FIG. 26 shows an operation sequence when two banks are provided and data are alternately written into the banks with the burst length of 4.

In clock cycle #0, bank address signal BA is set to the H level and an active command is issued. Bank #A is thus activated and a row selecting operation is carried out using a concurrently applied address signal ADD as row address signal X.

At a rising edge of external clock signal extCLK in clock cycle #1, row address strobe signal ZRAS is set to The H level, column address strobe signal ZCAS and write enable signal ZWE are set to the L level, and a write command is given. Bank address signal BA supplied at the same time as the write command is set to the H level, and an instruction of data writing into bank #A is given. When the write command is supplied, a column selection is carried out using the concurrently applied address signal ADD as a column address signal, and data writing is performed.

When data is written, data applied in a clock cycle in which a write command is supplied is taken into the SDRAM to perform the writing. In other words, data c0 supplied in clock cycle #1 is taken into the memory device. Column address signals are generated internally according to a prescribed sequence with address signal ADD supplied in clock cycle #1 in bank #A as a leading address, as when data is read out. In clock cycles #2, #3 and #4, column selecting operations are respectively carried out, and data c1, c2 and c3 supplied currently are successively written into selected memory cells in a prescribed sequence.

In parallel with the data writing operation for bank #A, in clock cycle #4, bank address signal BA is set to the L level and an active command is supplied. In this case, an instruction of activation of bank #B is supplied, and a row in a memory cell is selected using address signal ADD currently applied as row address signal X in bank #B. In the next clock cycle #5, bank address signal BA is set to the L level again and a write command is given. Accordingly, data b0 supplied in clock cycle #5 is taken into the SDRAM, and a data writing operation for bank #B is carried out. Burst address signals are thereafter internally generated according to a prescribed sequence in bank #B and a column selecting operation is internally performed. Data d1, d2 and d3 respectively supplied in clock cycles #6, #7 and #8 are taken into the memory device, and data is written into selected memory cells according to a prescribed sequence.

In parallel with the data writing operation for bank #B, in clock cycle #6, bank address signal BA is set to the H level and a precharge command is supplied. Bank #A is thus inactivated and a memory cell array returns to a precharge state.

In clock cycle #8, bank address signal BA is set to the H level again to supply active command. Bank #A in the inactive state is again activated and a memory cell row is selected. Next in clock cycle #9, bank address signal BA is set to the H level and a write command for bank #A is issued. From clock cycle #9, data writing for bank #A is carried out. After that, data c4, c5 . . . are written into selected memory cells in bank #A according to a prescribed sequence.

When data is written as above, banks #A and #B are alternately activated/inactivated and data are written. As a result, the RAS precharge time (a time required from returning of a memory cell array to the precharge state to driving thereof into the active state again) which is necessary for returning a selected or activated memory cell array to the precharge state at the time of the page switching never affects an external access. Data can be successively written in each clock cycle and a high speed data writing is achieved.

FIG. 27 shows a structure of a main portion of the conventional SDRAM. Referring to FIG. 27, the conventional SDRAM includes: a bank address input buffer 1 which takes in an externally supplied bank address signal BA at a rising edge of internal clock signal CLK generated synchronously with external clock signal extCLK and generates internal bank address signals BAi and /BAi that are complimentary to each other; a command decoder 2 which incorporates externally supplied control signals ZRAS, ZCAS and ZWE at a rising edge of internal clock signal CLK, determines the states of those signals and generates an operation mode instruction signal φ according to the result of the determination; and a bank control circuit 3 which outputs an operation mode designation signal for bank #A and bank #B according to operation mode instruction signal φ supplied from command decoder 2 as well as internal bank address signals BAi and /BAi supplied from bank address input buffer 1. Although operation mode instruction signals from command decoder 2 are generated corresponding to respective commands shown in FIG. 25 and 26, one signal φ represents the signals in FIG. 27.

Bank control circuit 3 includes an AND circuit 3a receiving internal bank address signal BAi and operation mode instruction signal φ, and an AND circuit 3b receiving internal bank address signal /BAi and operation mode instruction signal φ. Operation mode instruction signal φA is output for bank #A from AND circuit 3a, and operation mode instruction signal φB is output for bank #B from AND circuit 3b.

One of internal bank address signals BAi and /BAi generated by bank address input buffer 1 is at the H level, and the other is at the L level. As a result, an operation mode designation signal according to an operation mode instruction signal from command decoder 2 is output for only a bank designated by bank address signal BA, the operation mode instruction signal for the addressed bank attains an active state (H level), and the designated operation is carried out.

As shown in FIG. 27, if a command is supplied to SDRAM, bank address signal BA designating a bank for which an operation is carried out should be supplied. The reason is that an operation mode for a bank in the active state should be designated without fail since there is a case in which two banks are simultaneously being activated.

However, there is a case in which a high-speed access in such a bank interleave manner is not required but an access is made by always activating only one bank. In the field of the image processing, for example, if a memory device is structured such that pixel data on even fields are stored in one of two banks and pixel data on odd fields are stored in the other bank, only one bank is accessed during one field period so that one bank is successively accessed. In this case, if a bank to be activated according to a bank address signal is designated when an active command is given, an operation mode instruction is issued for the activated bank and a bank is not particularly required to be designated using a bank address signal when the read command, write command and precharge command are supplied. However, in the conventional SDRAM, once a bank is activated, an operation mode instruction for the bank should be thereafter issued concurrently with a bank address signal. In this case, the bank address signal would be unnecessarily driven, the electric power for driving the bank address signal is unnecessarily consumed, and the consumed power of the entire system cannot be decreased. Further, even if the banks are not simultaneously being activated, a bank address signal has to be supplied with a command. Even. if a bank in which some operation is carried out is apparent, an external controller should supply a bank address signal, resulting in increase of the load of the external controller.

SUMMARY OF THE INVENTION

An object of the present invention is to provide a synchronous semiconductor memory device by which the load of an external controller for designating a bank is reduced.

Another object of the invention is to provide a multi-bank semiconductor memory device capable of facilitating the bank control.

Still another object of the invention is to provide a multi-bank semiconductor memory device for which an operation mode is easily designated for a bank in an active state when only one bank is in the active state among a plurality of banks.

A semiconductor memory device according to a first aspect includes: a plurality of bank driving circuits provided corresponding to a plurality of banks respectively for driving corresponding banks according to a supplied operation mode designation signal; and a drive signal generating circuit coupled to the plurality of bank driving circuits for determining if each of the plurality of banks is in an active state or not and, when the result of the determination indicates that only one of the plurality of banks is in the active state, for outputting the operation mode designation signal corresponding to an operation mode instruction signal for one bank in the active state.

A semiconductor memory device according to a second aspect includes: a plurality of banks that can be driven into an active state and an inactive state independently of each other; a bank selecting circuit which receives a bank address signal supplied synchronously with a clock signal for generating a bank designation signal for a bank designated by the received bank address signal; a bank activating circuit which receives a bank activation instruction signal supplied synchronously with a clock signal for outputting an array activation signal to a bank designated by the bank designation signal from the bank selecting circuit; a circuit which receives an operation mode instruction signal different from the bank activation instruction signal supplied synchronously with a clock signal for generating an internal instruction signal corresponding to the received operation mode instruction signal; and a plurality of control circuits provided corresponding to the plurality of banks respectively, each receiving the bank designation signal from the bank selecting circuit as well as array activation signals for a corresponding bank and other banks from the bank activating circuit for supplying an operation mode activation signal according to the internal instruction signal to the corresponding bank while neglecting the bank designation signal from the bank selecting circuit when array activation signals for other banks are in the inactive state and the array activation signal for the corresponding bank is in the active state.

Whether the plurality of banks each are in the active state or in the inactive state is always monitored and when an operation mode instruction signal is supplied, an operation mode designation signal for performing the operation mode is supplied to a bank which is the one of the plurality of banks which is in the active state. Accordingly, even if a bank address signal is not supplied with the operation mode instruction signal, a designated operation mode can be carried out for the bank in the active state. There is no need of supplying a bank address signal with the operation mode instruction signal, an external controller is not required to monitor a bank in which the operation mode is carried out, a bank address signal is not required to be given concurrently with an operation mode instruction signal, and the load for designating a bank is reduced. As a result, an easy bank control is achieved and a multi-bank semiconductor memory device can be implemented which is excellent in usability.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a timing chart representing an operation at the time of data reading in a conventional synchronous semiconductor memory device.

FIG. 26 is a timing chart representing an operation at the time of data writing in the conventional synchronous semiconductor memory device.

DESCRIPTION OF THE PREFERRED EMBODIMENTS (First Embodiment)

Figure 1:
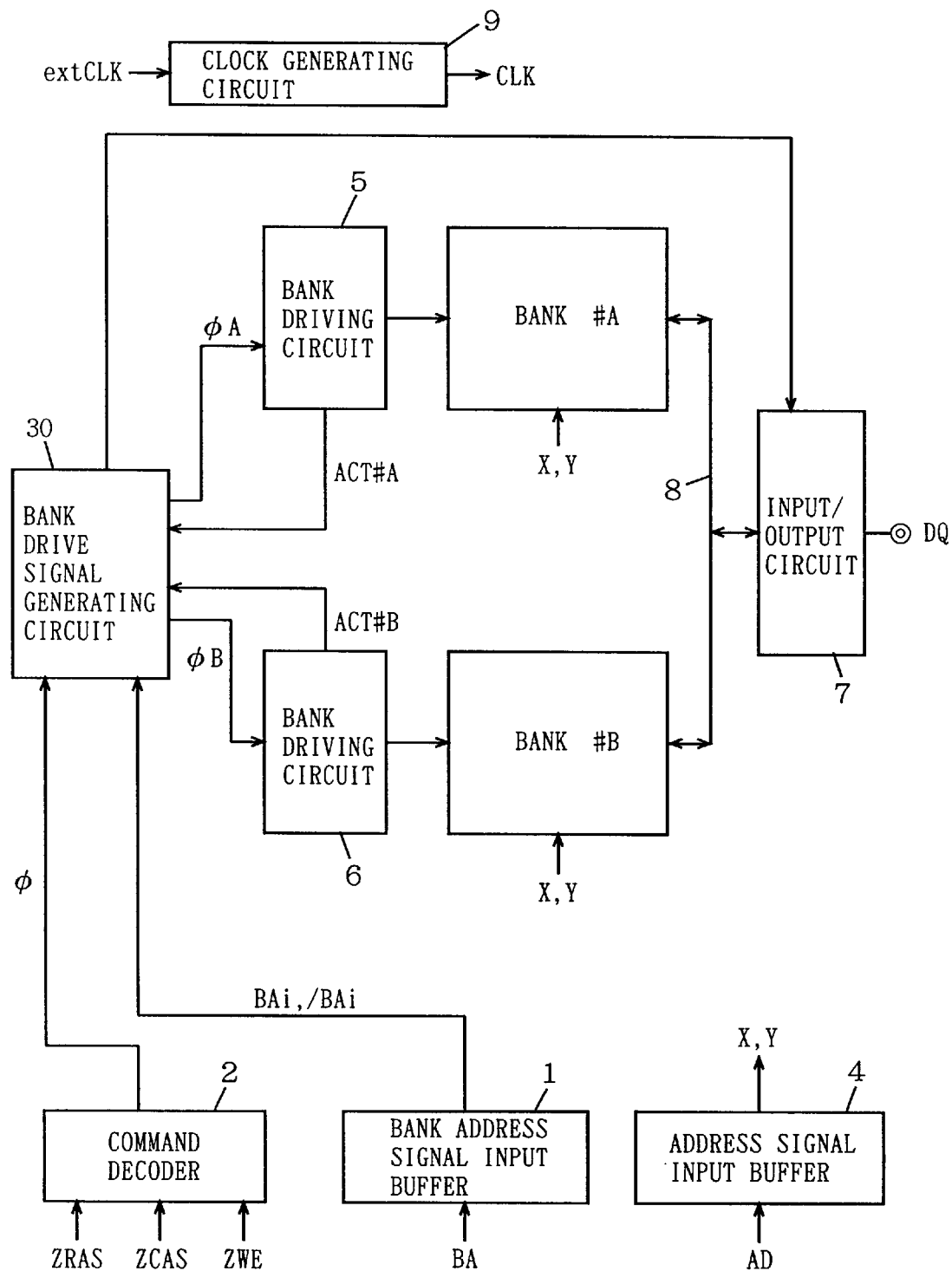
FIG. 1 schematically shows an entire structure of a semiconductor memory device according to the first embodiment of the present invention.

FIG. 1 schematically shows an entire structure of a semiconductor memory device according to the first embodiment of the invention. Referring to FIG. 1, the semiconductor memory device includes two banks #A and #B. Each of banks #A and #B includes a plurality of memory cells arranged in rows and columns, a circuit for driving the rows and columns respectively into a selected state, and a read/write circuit for writing/reading data. The structures of banks #A and #B are detailed later. Bank driving circuits 5 and 6 are respectively provided for banks #A and #B for controlling operations of banks #A and #B according to operation mode designation signals φA and φB supplied from a bank drive signal generating circuit 30.

Bank driving circuits 5 and 6 respectively output array activation signals ACT#A and ACT#B which drive and hold corresponding banks #A and #B in an active state. When array activation signals ACT#A and ACT#B are in the active state, banks #A and #B are respectively in the active state to enable writing/reading of data during the period in this state. Activation/inactivation of array activation signals ACT#A and ACT#B is controlled by the operation mode designation signal from bank drive signal generating circuit 30.

Bank drive signal generating circuit 30 outputs various operation mode designation signals according to an operation mode instruction signal supplied from a command decoder 2. In FIG. 1, operation mode designation signal φA for bank #A and operation mode designation signal φB for bank #B are representatively shown.

Bank drive signal generating circuit 30 receives array activation signals ACT#A and ACT#B from bank driving circuits 5 and 6, and generates an operation mode designation signal for a bank which is addressed according to bank address signals BAi and /BAi supplied from a bank address signal input buffer 1 if array activation signals ACT#A and ACT#B are both in the active state. If only one of array activation signals ACT#A and ACT#B is in the active state, bank drive signal generating circuit 30 outputs, when operation mode instruction signal φ is supplied from command decoder 2, an operation mode designation signal according to the supplied operation mode instruction signal for the bank in the active state. In this case, internal bank address signals BAi and /BAi from bank address signal input buffer 1 are neglected.

If both of array activation signals ACT#A and ACT#B are in an inactive state, banks #A and #B are both in the inactive state. In this case, bank drive signal generating circuit 30 outputs an operation mode designation signal for activating a corresponding bank, only when a bank activation instruction signal is supplied from command decoder 2, that is, when an active command is supplied.

As described above, if only one bank is in the active state, there is no need to supply a bank address signal. The bank address signal is not required to be supplied when data is written/read into/from the bank and when the precharge operation is carried out for the bank. As a result, the load of an external controller for the bank control is reduced.

The semiconductor memory device further includes: an address signal input buffer 4 which receives externally supplied address signal AD, generates internal row address signal X and internal column address signal Y, and supplies them to banks #A and #B; an input/output circuit 7 coupled to banks #A and #B via a common internal data bus 8, which inputs/outputs data between a selected (addressed) bank and an external device under control of bank drive signal generating circuit 30; and a clock generating circuit 9 which generates internal clock signal CLK synchronous with external clock signal extCLK. Internal clock signal CLK from clock generating circuit 9 is supplied to each circuit and an internal operation is carried out synchronously with internal clock signal CLK. Description of the structure of each unit is next given.

(Structure of Bank Address Signal Buffer)

Figure 2:
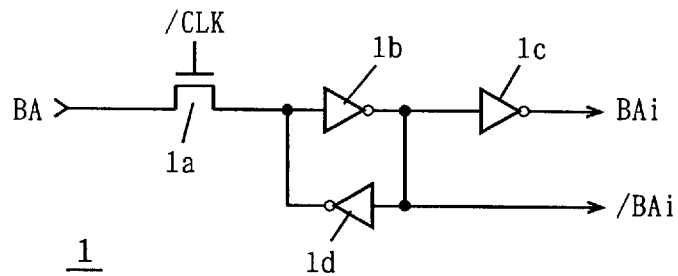
FIG. 2 schematically shows a structure of a bank address signal input buffer shown in FIG. 1.

FIG. 2 shows one example of a structure of bank address signal input buffer 1 shown in FIG. 1. Referring to FIG. 2, bank address signal input buffer 1 includes: a transfer gate 1a formed of an n channel MOS transistor and rendered conductive when an inverted signal /CLK of internal clock signal CLK is at the H level and passes externally supplied bank address signal BA; two-stage cascaded inverters 1b and 1c which receive a bank address signal from transfer gate 1a and generates internal bank address signal BAi; and an inverter 1d which inverts a signal output from inverter 1b and transmits the inverted signal to the input portion of inverter 1b. A complimentary internal bank address signal /BAi is generated by inverter 1b.

In the structure of bank address signal input buffer 1 shown in FIG. 2, when internal clock signal CLK attains the H level, inverted internal clock signal /CLK becomes the L level and transfer gate 1a becomes a non-conductive state. Accordingly, externally supplied bank address signal BA is taken to be latched by inverters 1b and 1d, and internal bank address signals BAi and /BAi attain a defined state. Externally supplied bank address signal BA is thus taken synchronously with a clock signal and internal bank address signals BAi and /BAi can be generated in each clock cycle.

Address signal input buffer 4 shown in FIG. 1 also has a structure similar to that of bank address signal input buffer 1 shown in FIG. 2.

(Structure of Command Decoder)

Figure 3:
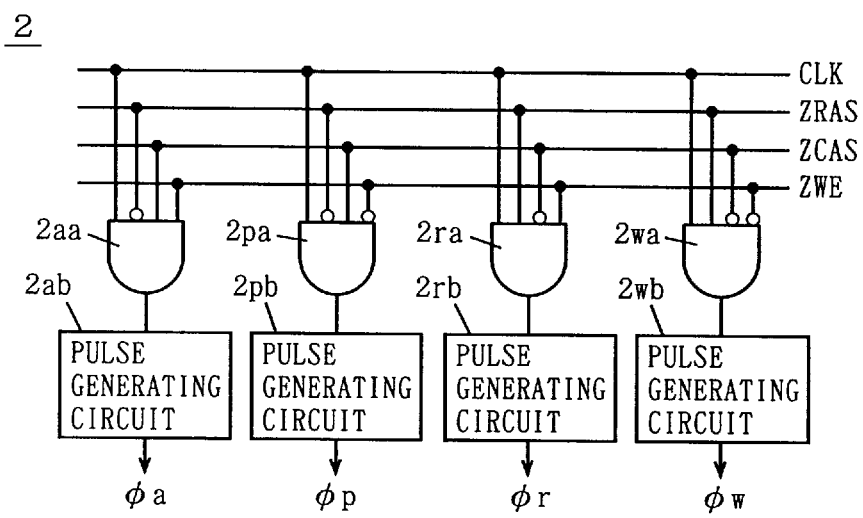
FIG. 3 schematically shows a structure of a command decoder shown in FIG. 1.

FIG. 3 schematically shows a structure of command decoder 2 shown in FIG. 1. Referring to FIG. 3, command decoder 2 includes gate circuits 2aa, 2pa, 2ra and 2wa each receiving a set of internal clock signal CLK, row address strobe signal ZRAS, column address strobe signal ZCAS and write enable signal ZWE.

Gate circuit 2aa outputs a signal at the H level when row address strobe signal ZRAS is at the L level, and internal clock signal CLK, column address strobe signal ZCAS and write enable signal ZWE are at the H level.

Gate circuit 2pa outputs signal at the H level when row address strobe signal ZRAS and write enable signal ZWE are both at the L level and internal clock signal CLK and column address strobe signal ZCAS are at the H level.

Gate circuit 2ra outputs a signal at the H level when internal clock signal CLK, row address strobe signal ZRAS and write enable signal ZWE are at the H level and column address strobe signal ZCAS is at the L level.

Gate circuit 2wa outputs a signal at the H level when internal clock signal CLK and row address strobe signal ZRAS are both at H level and column address strobe signal ZCAS and write enable signal ZWE are both at the L level.

In other words, gate circuit 2aa outputs a signal at the H level when an active command is supplied, gate circuit 2pa outputs a signal at the H level when a precharge command is supplied, gate circuit 2ra outputs a signal at the H level when a read command is supplied, and gate circuit 2wa outputs a signal at the H level when a write command is supplied.

Pulse generating circuits 2ab, 2pb, 2rb, and 2wb, each of which outputs a one-shot pulse signal having a prescribed time width responsive to the rising of an output signal from a corresponding gate circuit, are respectively provided corresponding to gate circuits 2aa, 2pa, 2ra and 2wa. Array activation instruction signal φa is output from pulse generating circuit 2ab, precharge instruction signal φp is output from pulse generating circuit 2pb, read operation instruction signal φr is output from pulse generating circuit 2rb, and write operation instruction signal φw is output from pulse generating circuit 2wb.

An instructed operation is activated according to these signals φa, φp, φr and φw as operation mode instruction signals.

Figure 4:
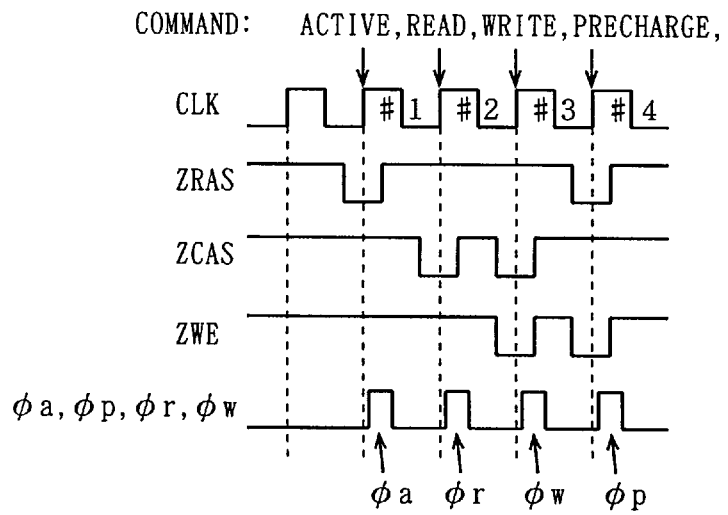
FIG. 4 is a timing chart representing an operation of a command decoder shown in FIG. 3.

FIG. 4 is a timing chart representing an operation of the command decoder shown in FIG. 3. Description of an operation of the command decoder shown in FIG. 3 is given below referring to FIG. 4.

When the active command is supplied in clock cycle #1, a signal output from gate circuit 2aa shown in FIG. 3 attains the H level, and array activation instruction signal φa from pulse generating circuit 2ab is at the H level for a prescribed period. Other signals φp, φr and φw maintain the inactive state at the L level.

When the read command is supplied in clock cycle #2, a signal output from gate circuit 2ra shown in FIG. 3 attains the H level and read operation instruction signal φr from pulse generating circuit 2rb is at the H level for a prescribed period. Other signals φa, φw and φp maintain the inactive state at the L level.

When the write command is supplied in clock cycle #3, a signal output from gate circuit 2wa attains the H level and write operation instruction signal φw from pulse generating circuit 2wb is in the active state at the H level for a prescribed period. Remaining signals φa, φr and φp maintain the inactive state at the L level.

When the precharge command is supplied in clock cycle #4, a signal output from gate circuit 2pa goes to the H level and precharge instruction signal φp from pulse generating circuit 2pb is at the H level for a prescribed period. Signals φa, φr and φw maintain the inactive state at the L level.

By outputting an internal operation mode instruction signal according to a combination of the logic states of the control signals at the rising edge of internal clock signal CLK using the command decoder shown in FIG. 3, an internal operation mode is designated at the rising edge of internal clock signal CLK. Thus, there is no need to consider the margin for the skew of external control signals ZRAS, ZCAS and ZWE, so that the internal operation can be started at a fast timing. Further, by outputting an operation mode instruction signal in the form of a oneshot pulse signal using pulse generating circuits 2ab, 2pb, 2rb and 2wb, an operation mode instruction signal having a prescribed time width can be generated without fail.

(Modification of Command Decoder)

Figure 5:
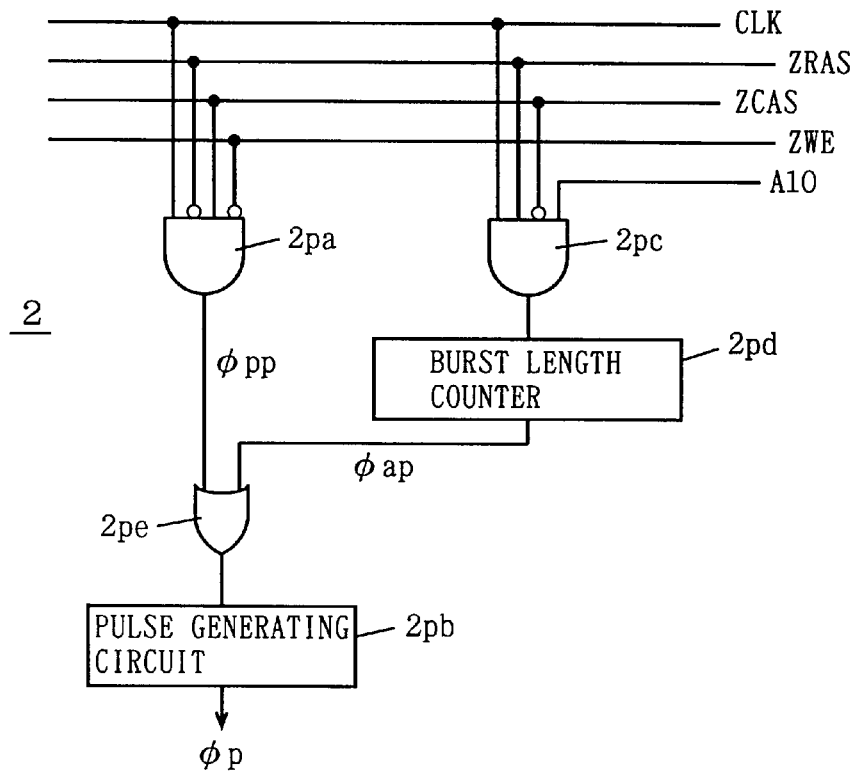
FIG. 5 schematically shows a structure of a modification of the command decoder shown in FIG. 1.

FIG. 5 shows a structure of a modification of the command decoder shown in FIG. 1. A structure of only a portion which generates the precharge operation instruction signal is shown in FIG. 5. The structures of the portions which generate array activation instruction signal φa, read operation instruction signal φr and write operation instruction signal φw are similar to those of the command decoder shown in FIG. 3.

Referring to FIG. 5, the command decoder includes: a gate circuit 2pc which receives internal clock signal CLK, row address strobe signal ZRAS, column address strobe signal ZCAS and a specific address signal bit A10; a burst length counter 2pd activated responsive to activation of a signal output from gate circuit 2pc, to count a period of the burst length; a gate circuit 2pa which receives internal clock signal CLK, row address strobe signal ZRAS, column address strobe signal ZCAS and write enable signal ZWE; an OR circuit 2pe which receives an output signal φpp from gate circuit 2pa and a count up signal φap from burst length counter 2pd; and a pulse generating circuit 2pb responsive to activation of a signal output from OR circuit 2pe, to output precharge instruction signal Zp having a prescribed time width.

The structures of gate circuit 2pa and pulse generating circuit 2pb are similar to those shown in FIG. 3. Gate circuit 2pc outputs a signal in the active state at the H level when internal clock signal CLK and row address strobe signal ZRAS are at the H level, column address strobe signal ZCAS is at the L level, and address signal bit A10 is at the H level. Gate circuit 2pc thus outputs a signal at the H level when the read command or the write command is supplied and address signal bit A10 is set at the H level (when an automatic precharge command is supplied). Burst length counter 2pd shifts (delays) a signal output from gate circuit 2pc by a period of the burst length, and outputs precharge instruction signal φap when the burst length period has passed. OR circuit 2pe outputs a signal in the active state at the H level when one of signal φpp from gate circuit 2pa and signal φap from burst length counter 2pd attains the active state.

Figure 6:
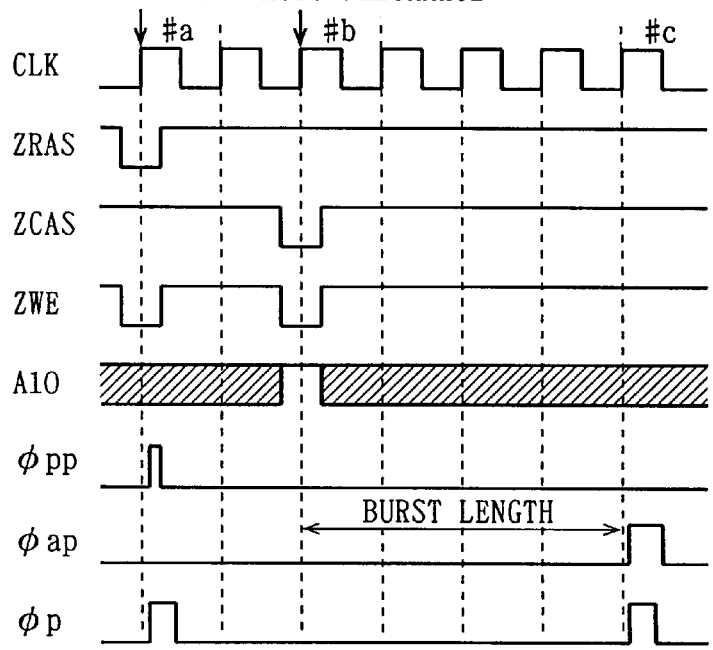
FIG. 6 is a timing chart representing operation of a command decoder shown in FIG. 5.

Precharge trigger signal φp attains the active state when the precharge command or the automatic precharge command is supplied. Referring to FIG. 6 representing the timing chart, an operation of the command decoder shown in FIG. 5 is described.

When the precharge command is supplied in clock cycle #a, output signal φpp from gate circuit 2pa goes to the H level and a signal output from OR circuit 2pe accordingly goes to the H level. Pulse generating circuit 2pb, in response to activation of the output signal from OR circuit 2pe, outputs precharge instruction signal φp having a prescribed time width.

In clock cycle #b, row address strobe signal ZRAS and address signal bit A10 are set at the H level and column address strobe signal ZCAS is set at the L level. Write enable signal ZWE is set at the H or the L level according to the read or the write command. The combination of these signals is the automatic precharge command so that a signal output from gate circuit 2pc attains the H level and burst length counter 2pd is activated. Suppose that the burst length is 4, count up signal φap from burst length counter 2pd attains the H level in clock cycle φc after four clock cycles have passed, and precharge instruction signal φp output from pulse generating circuit 2pb via OR circuit 2pe is at the H level for a prescribed period.

Using the automatic precharge command, the precharge command can be supplied simultaneously with the application of the read command or the write command, and another command can be applied in clock cycle #c. Further, an external controller has no need to newly apply the precharge command after the read or the write operation is carried out, resulting in simplification of the command application sequence.

(Structure of Bank Drive Signal Generating Circuit 1)

Figure 7:
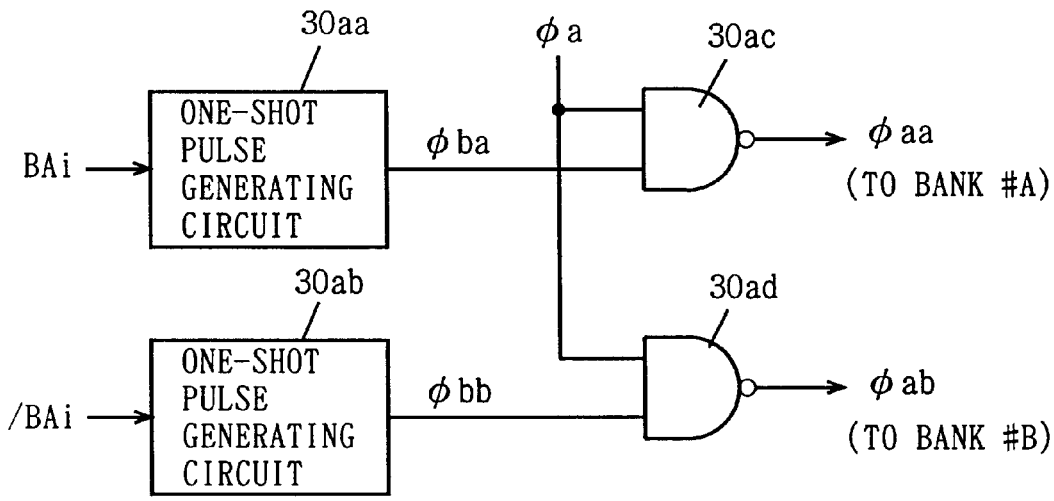
FIG. 7 shows one example of a structure of an array activation instruction signal generating unit in a bank drive signal generating circuit shown in FIG. 1.

FIG. 7 schematically shows a structure of a portion which generates an array activation instruction signal related to activation of the array in bank drive signal generating circuit 30. Referring to FIG. 7, bank drive signal generating circuit 30 includes: a one-shot pulse generating circuit 30aa which generates a bank designation signal φba of a one-shot pulse signal when bank address signal bit BAi is at the H level; a one-shot pulse generating circuit 30ab which outputs a bank designation signal φbb of a one-shot pulse signal when bank address signal /BAi is at the H level; an NAND circuit 30ac which receives bank designation signal φba from one-shot pulse generating circuit 30aa and array activation instruction signal φa from the command decoder and outputs an array activation trigger signal φaa for bank #A; and an NAND circuit 30ad which receives bank designation signal φbb from one-shot pulse generating circuit 30ab and array activation instruction signal φa and outputs an array activation trigger signal φab for bank #B. Now an operation of the array activation trigger signal generating portion shown in FIG. 7 is described referring to the timing chart of FIG. 8.

Figure 8:
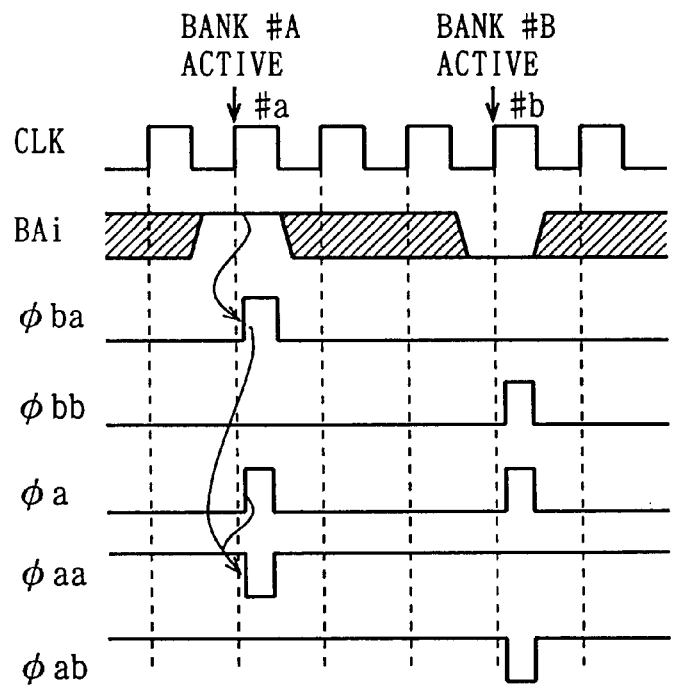
FIG. 8 is a timing chart representing an operation of the circuit shown in FIG. 7.

Referring to FIG. 8, an active command for bank #A is supplied in clock cycle #a. Bank #A is designated when bank address signal BAi is at the H level. Bank designation signal φba from one-shot pulse generating circuit 30aa is at the H level for a prescribed period. Bank designation signal φbb from one-shot pulse generating circuit 30ab maintains the L level. Since the active command is supplied, array activation trigger signal φaa from NAND circuit 30ac is driven to the active state at the L level according to array activation instruction signal φa supplied from the command decoder. The active state of the array activation trigger signal is set at the L level in order to follow the logic of the structure of the circuit portion for array activation in the bank driving circuit.

In clock cycle #b, an active command for bank #B is supplied. Bank #B is designated when bank address signal BAi is at the L level. Bank designation signal φbb is driven to the H level by one-shot pulse generating circuit 30ab according to complimentary bank address signal /BAi at the H level. Command decoder drives array activation instruction signal φa to the H level for a prescribed period according to the active command. As a result, array activation trigger signal φab from NAND circuit 30ad is in the active state at the L level for prescribed period.

The active command is always supplied simultaneously with the bank address signal. As detailed later, whether the bank address signal is valid/invalid is determined according to the number of banks that are in the active state, as for an operation mode instruction supplied to the bank in the active state.

(Structure of Row-Related Circuit Portion of Bank)

Figure 9:
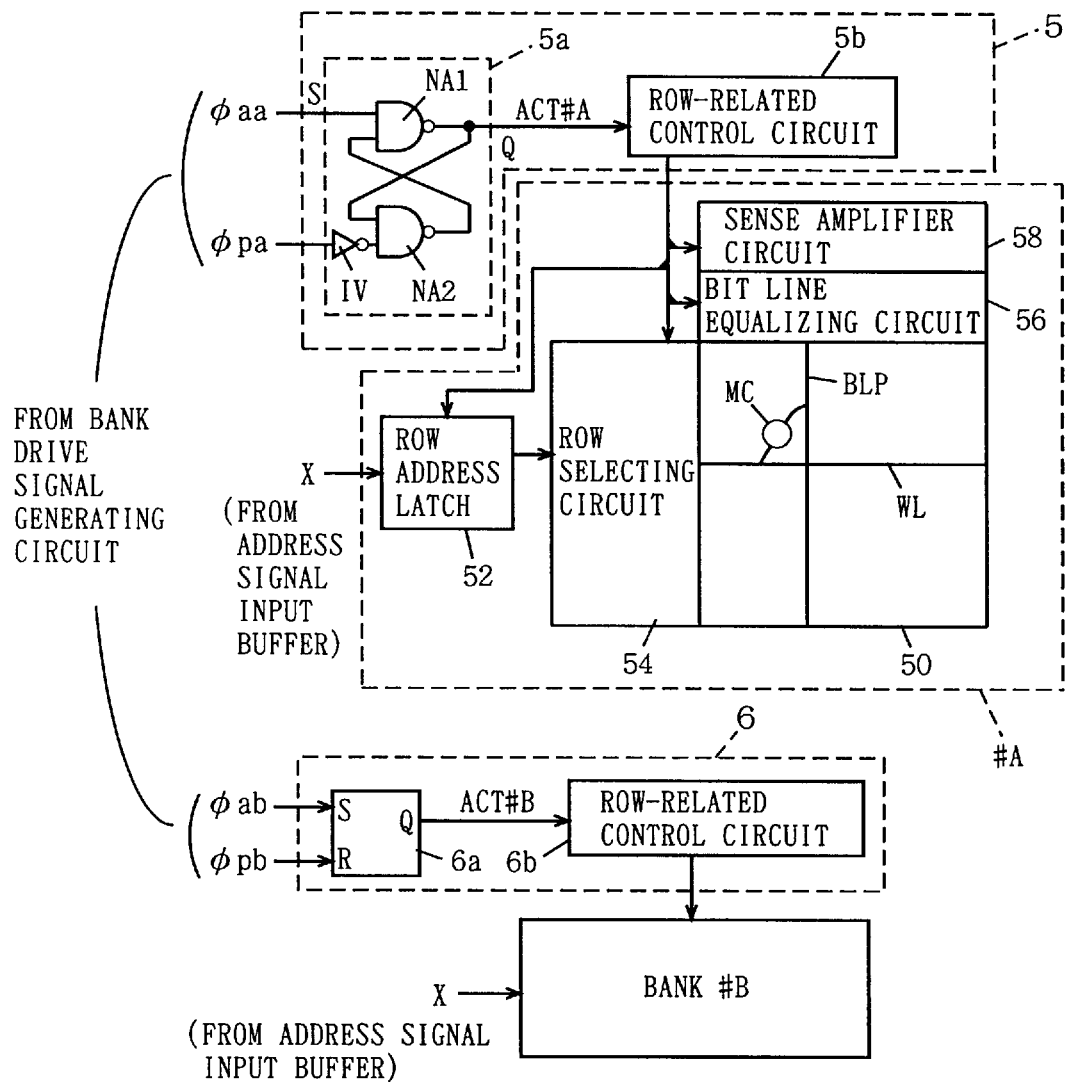
FIG. 9 schematically shows a structure of a portion relating to row selection in the semiconductor memory device shown in FIG. 1.

FIG. 9 schematically shows a structure of a portion related to row selection of bank drive circuits 5 and 6 for banks #A and #B. Since banks #A and #B have a similar structure, a structure of bank #A is specifically shown in FIG. 9. Referring to FIG. 9, bank #A includes a memory cell array 50 having a plurality of memory cells MC arranged in rows and columns. Memory cell array 50 includes a word line WL which is arranged corresponding to each row of memory cells MC and to which memory cells on a corresponding row is connected, and includes a plurality of bit line pairs BLP which are arranged corresponding to respective columns of memory cells and to which memory cells on corresponding columns are connected. In FIG. 9, one bit line pair BLP, one word line WL and a memory cell MC disposed corresponding to the crossing of bit line pair BLP and word line WL are representatively shown. Memory cell MC has a structure of the dynamic memory cell of the one transistor/one capacitor type.

Bank #A further includes: a row address latch 52 which latches row address signal X supplied from the address signal input buffer shown in FIG. 1 when activated; a row selecting circuit 54 which drives a word line corresponding to an addressed row in memory cell array 50 into the selected state according to the internal row address signal latched by row address latch 52 when activated; a sense amplifier circuit 58 which senses, amplifies and latches data of memory cells connected to the selected word line when activated; and a bit line equalizing circuit 56 which precharges and equalizes the potential of each bit line of the bit line pair BLP to a prescribed potential when activated.

Row selecting circuit 54 includes a decoding circuit which decodes the internal row address signal latched by row address latch 52, and a word line driving circuit which drives a corresponding word line to the selected state according to a signal output from the decoding circuit. Sense amplifier circuit 58 includes a plurality of sense amplifiers provided corresponding to respective bit line pairs that differentially amplify the potential of the corresponding bit line pairs. Bit line equalizing circuit 56 includes a bit line precharging/equalizing circuit provided corresponding to each bit line pair for precharging and equalizing each bit line of the corresponding bit line pair to a prescribed potential.

Bank driving circuit 5 provided for bank #A includes a set/reset flip-flop 5a which is set responsive to activation of array activation trigger signal φaa supplied from the bank drive signal generating circuit shown in FIG. 1 and is reset responsive to precharge trigger signal φpa, to output array activation signal ACT#A, and also includes a row-related control circuit 5b which outputs a control signal for controlling the operation of a row-related circuit of bank #A according to activation of array activation signal ACT#A from set/reset flip-flop 5a. Row-related control circuit 5b controls activation/inactivation of row address latch 52, row selecting circuit 54, bit line equalizing circuit 56 and sense amplifier circuit 58. The structure of row-related control circuit 5b is equivalent to the structure for latching the row address signal, decoding the row address signal, driving the word line to the selected state, and activating the sense amplifier in a prescribed sequence according to activation of internal row address strobe signal RAS in a standard DRAM. Bit line equalizing circuit 56 is held in the inactive state when array activation signal ACT#A is activated.

Set/reset flip-flop 5a includes an NAND circuit NA1 which receives array activation trigger signal φaa at one input and outputs array activation signal ACT#A, and an NAND circuit NA2 which receives precharge trigger signal φpa supplied via inverter IV and array activation signal ACT#A and supplies the output signal to the other input of NAND circuit NA1.

Bank driving circuit 6 for bank #B includes a set/reset flip-flop 6a which receives array activation trigger signal φab at set input S and receives precharge trigger signal φpb at reset input R and outputs array activation signal ACT#B from output Q, and a row-related control circuit 6b which activates the row-related circuit of bank #B in a prescribed sequence in response to activation of array activation signal ACT#B from set/reset flip-flop 6a. Referring to the timing chart of FIG. 10, an operation of the bank driving circuit shown in FIG. 9 will be now described.

Figure 10:
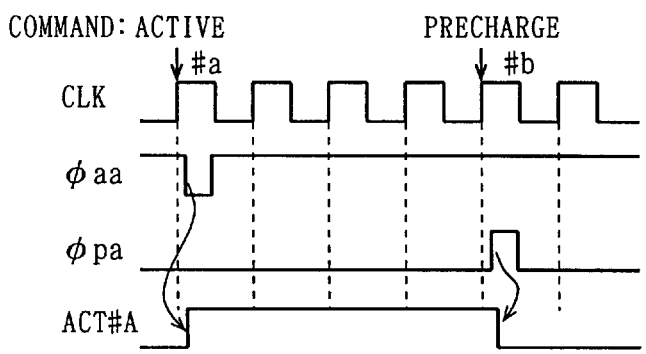
FIG. 10 is a timing chart representing an operation of a bank driving circuit shown in FIG. 9.

A difference between bank driving circuit 5 and bank driving circuit 6 is that they receive different trigger signals. In FIG. 10, an operation of bank driving circuit 5 for bank #A is represented. In clock cycle #a, an active command for bank #A is supplied, and array activation trigger signal φaa from bank drive signal generating circuit 30 shown in FIG. 7 becomes the active state at the L level for a prescribed period. When array activation trigger signal φaa becomes the L level, array activation signal ACT#A output from NAND circuit NA1 attains the active state at the H level in set/reset flip-flop 5a included in bank driving circuit 5. Accordingly, row-related control circuit 5b is activated, the supplied row address signal X is latched by row address latch 52, row selecting circuit 54 is activated and sense amplifier circuit 58 is activated. Bit line equalizing circuit 56 is driven to the inactive state according to activation of array activation signal ACT#A.

Even if array activation trigger signal φaa returns to the H level from the L level, precharge trigger signal φpa is still in the inactive state at the L level and a signal output from NAND circuit NA2 is at the H level. Therefore, array activation signal ACT#A is latched by set/reset flip-flop 5a and held at the H level.

In clock cycle #b, a precharge command is supplied for bank #A or alternatively an automatic precharge command is supplied in the previous cycle, and precharge trigger signal φpa from bank drive signal generating circuit 30 is driven to the H level for a prescribed period as described later. A signal output from inverter IV thus becomes the L level, a signal output from NAND circuit NA1 attains the H level, and array activation signal ACT#A from NAND-circuit NA1-is accordingly driven to the inactive state of the L level. In response to inactivation of array activation signal ACT#A, row-related control circuit 5b drives row selecting circuit 54 and sense amplifier circuit 58 into the inactive state and drives bit line equalizing circuit 56 into the active state. Row address latch 52 is reset. As a result, bank #A is inactivated.

When bank #B is activated, array activation signal ACT#B is activated according to activation of array activation trigger signal φab. Completion of array activation in bank #B is achieved by activating precharge trigger signal φpb.

The state in which a word line is driven into the selected state, and data in a memory cell connected to the selected row is sensed, amplified and latched by sense amplifier circuit 58, is referred to as "activation of bank."

As shown in FIG. 9, if the array activation trigger signal is supplied, the bank maintains its active state until the precharge instruction signal is next supplied thereto. Array activation trigger signal φa and precharge instruction signal φp are generated in the form of the one-shot pulse signal. Therefore, bank #A and #B can be activated/inactivated independently of each other in each clock cycle.

(Structure of Bank Drive Signal Generating Circuit for Row-Related Circuit)

Figure 11:
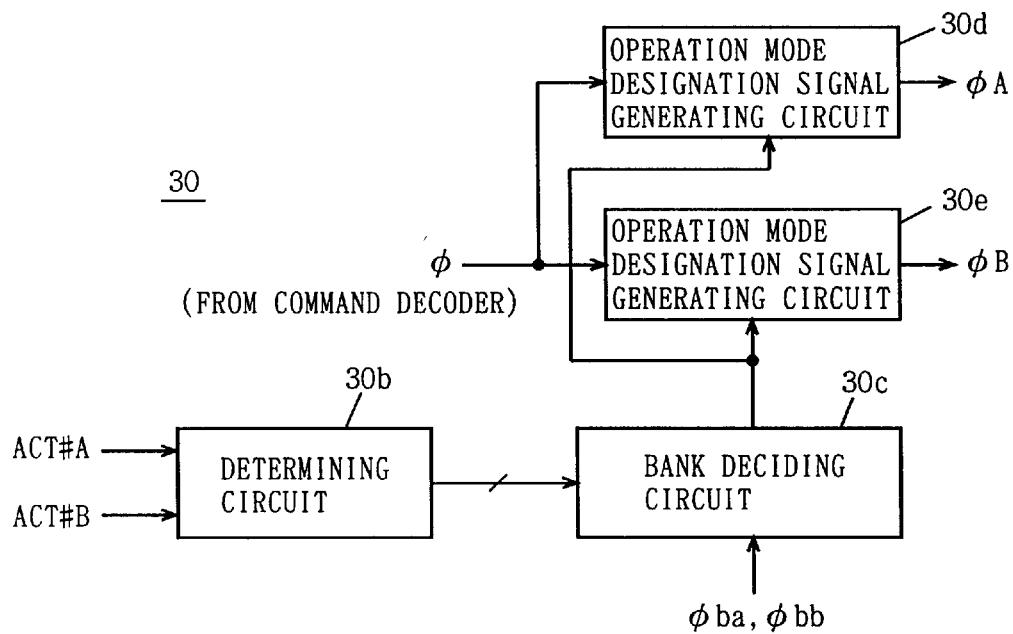
FIG. 11 schematically shows a structure of a portion which generates an operation mode designation signal according to a command other than the active command in the bank drive signal generating circuit shown in FIG. 1.

FIG. 11 schematically shows a structure of a portion other than the portion generating the array activation trigger signal of bank drive signal generating circuit 30 shown in FIG. 1. Referring to FIG. 11, bank drive signal generating circuit 30 includes: a determining circuit 30b which receives array activation signals ACT#A and ACT#B from bank driving circuits 5 and 6 shown in FIG. 9, determines if banks #A and #B are both in the active state or not and outputs a signal indicating the result of the determination; a bank deciding circuit 30c which receives a signal indicating the result of the determination by determining circuit 30b as well as bank designation signals φba and φbb and decides a bank to be selected according to the determination; and operation mode designation signal generating circuits 30d and 30e that output operation mode designation signals φA and φB for banks #A and #B according to operation mode instruction signal φ from the command decoder and the bank designation signal from bank deciding circuit 30c. Although operation mode designation signals φA and φB are respectively shown representatively, the designation signals include a read operation designation signal, a write operation designation signal and a precharge operation designation signal as detailed later.

Bank deciding circuit 30c selects one of operation mode designation signal generating circuit 30d and 30e according to bank designation signals φba and φbb if determining circuit 30b signals that both of banks #A and #B are in the active state. If determining circuit 30b signals that only one bank is in the active state, bank deciding circuit 30c selects an operation mode designation signal generating circuit provided for the bank in the active state. Further, bank deciding circuit 30c sets both of operation mode designation signal generating circuits 30d and 30e into the non-selected state if determining circuit 30b signals that both of banks #A and #B are in the inactive state. The reason is that any significant operation is not carried out for banks #A and #B even if an operation mode designation signal is supplied to the bank in the inactive state.

(Specific Structure of Bank Drive Signal Generating Circuit)

Figure 12:
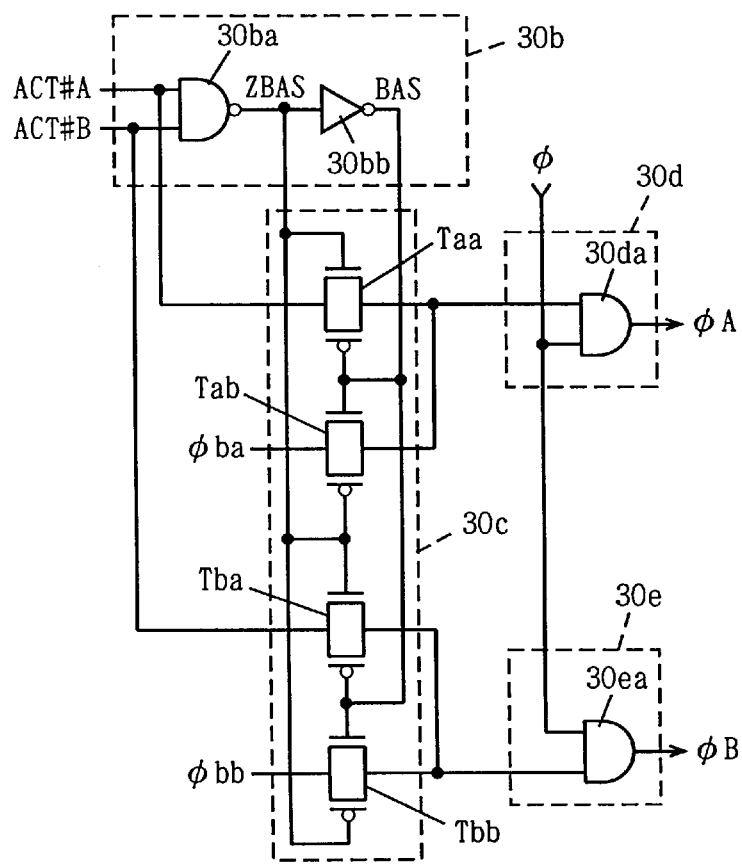
FIG. 12 shows one example of a structure of the bank drive signal generating circuit shown in FIG. 11.

FIG. 12 shows a specific structure of bank drive signal generating circuit 30 shown in FIG. 11. Referring to FIG. 12, determining circuit 30b includes an NAND circuit 30ba receiving array activation signals ACT#A and ACT#B, and an inverter 30bb receiving a signal output from NAND circuit 30ba. Selection signals ZBAS and BAS indicating if banks #A and #B are both in the active state or not are output from determining circuit 30b, array activation signals ACT#A and ACT#B indicating a bank to be driven to the active state are output also from determining circuit 30b, and those signals from determining circuit 30bare supplied to bank deciding circuit 30c.

Bank deciding circuit 30c includes: a CMOS transmission gate Taa which becomes conductive when selection signals ZBAS and BAS from determining circuit 30b are in the inactive state and at least one bank is indicated to be in the inactive state, to pass array activation signal ACT#A from determining circuit 30b; a CMOS transmission gate Tab which becomes conductive when selection signals ZBAS and BAS are in the active state indicating both banks to be in the active state, to pass bank designation signal bank designating bank #A; a CMOS transmission gate φba which becomes conductive responsive to the inactive state of selection signals ZBAS and BAS, to pass array activation signal ACT#B from determining circuit 30b; and a CMOS transmission gate φbb which becomes conductive when selection signals ZBAS and BAS are in the active state, to pass bank designation signal φbb designating bank #B.

Selection signals ZBAS and BAS are set at the L level and the H level in the active state respectively when array activation signals ACT#A and ACT#B are both at the H level in the active state.

Operation mode designation signal generating circuit 30d includes an AND circuit 30da which outputs operation mode designation signal φA for bank #A according to operation mode instruction signal φ from the command decoder and a signal supplied from one of CMOS transmission gates φaa and φab. Operation mode designation signal generating circuit 30e outputs operation mode designation signal φB for bank #B according to operation mode instruction signal φ from the command decoder and a signal supplied from one of transmission gates φba and φbb. An operation of the bank drive signal generating circuit shown in FIG. 12 will be now described, referring to the timing charts shown in FIGS. 13 and 14.

Figure 13:
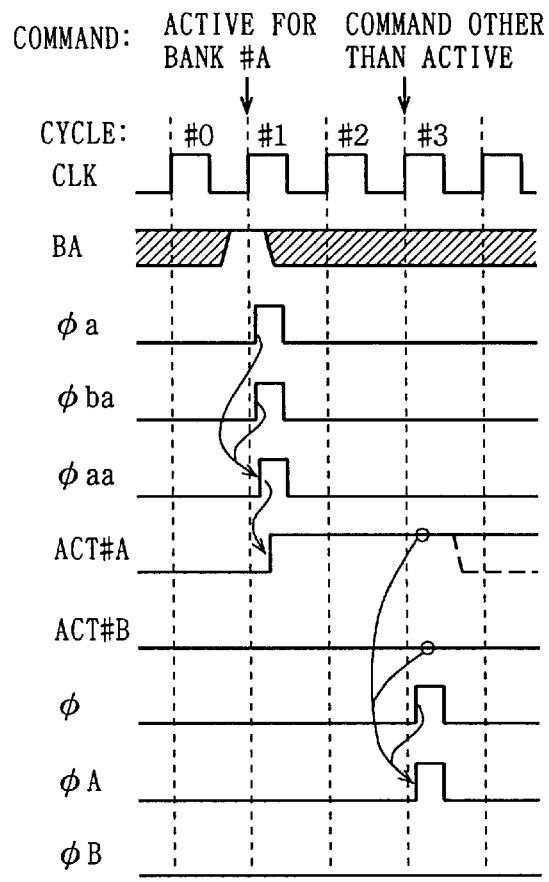
FIGS. 13 and 14 are timing charts representing operations of the bank drive signal generating circuit shown in FIG. 12.
Figure 27:
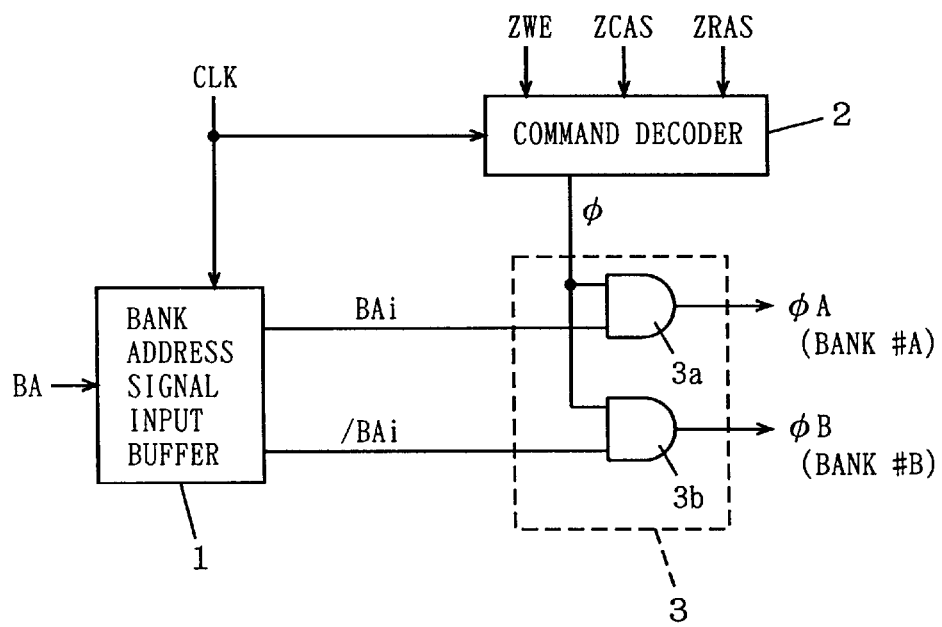
FIG. 27 schematically shows a structure of an internal operation mode designation signal generating portion in the conventional synchronous semiconductor memory device.

Referring to FIG. 13 first, an operation of bank drive signal generating circuit 30 when only one bank is in the active state is described.

In clock cycle #0, banks #A and #B are both in the inactive state, and array activation signals ACT#A and ACT#B are both at the L level.

In clock cycle #1, an active command for bank #A is supplied. Since bank #A is designated when bank address signal BA is at the H level, bank designation signal φba designating bank #A attains the H level and array activation instruction signal φa from the command decoder becomes the active state at the H level for a prescribed period. As described with reference to FIGS. 9 and 10, array activation trigger signal φaa for bank #A attains the H level and array activation signal ACT#A attains the H level accordingly.

In clock cycle #3, a command other than the active command is supplied. In clock cycle #3, selection signals ZBAS and BAS from determining circuit 30b shown in FIG. 12 are respectively at the L level and the H level, and CMOS transmission gates φaa and φba selecting array activation signals ACT#A and ACT#B are in the conductive state in bank deciding circuit 30c. Since array activation signal ACT#A is at the H level and array activation signal ACT#B is at the L level, operation mode designation signal φA from operation mode designation signal generating circuit 30d is in the active state at the H level for a prescribed period for the command other than the active command. Accordingly, a designated operation mode is carried out in bank #A. If the command supplied in clock cycle #3 is the precharge command, array activation signal ACT#A is driven into the L level as shown in the broken line in FIG. 13.

Figure 14:
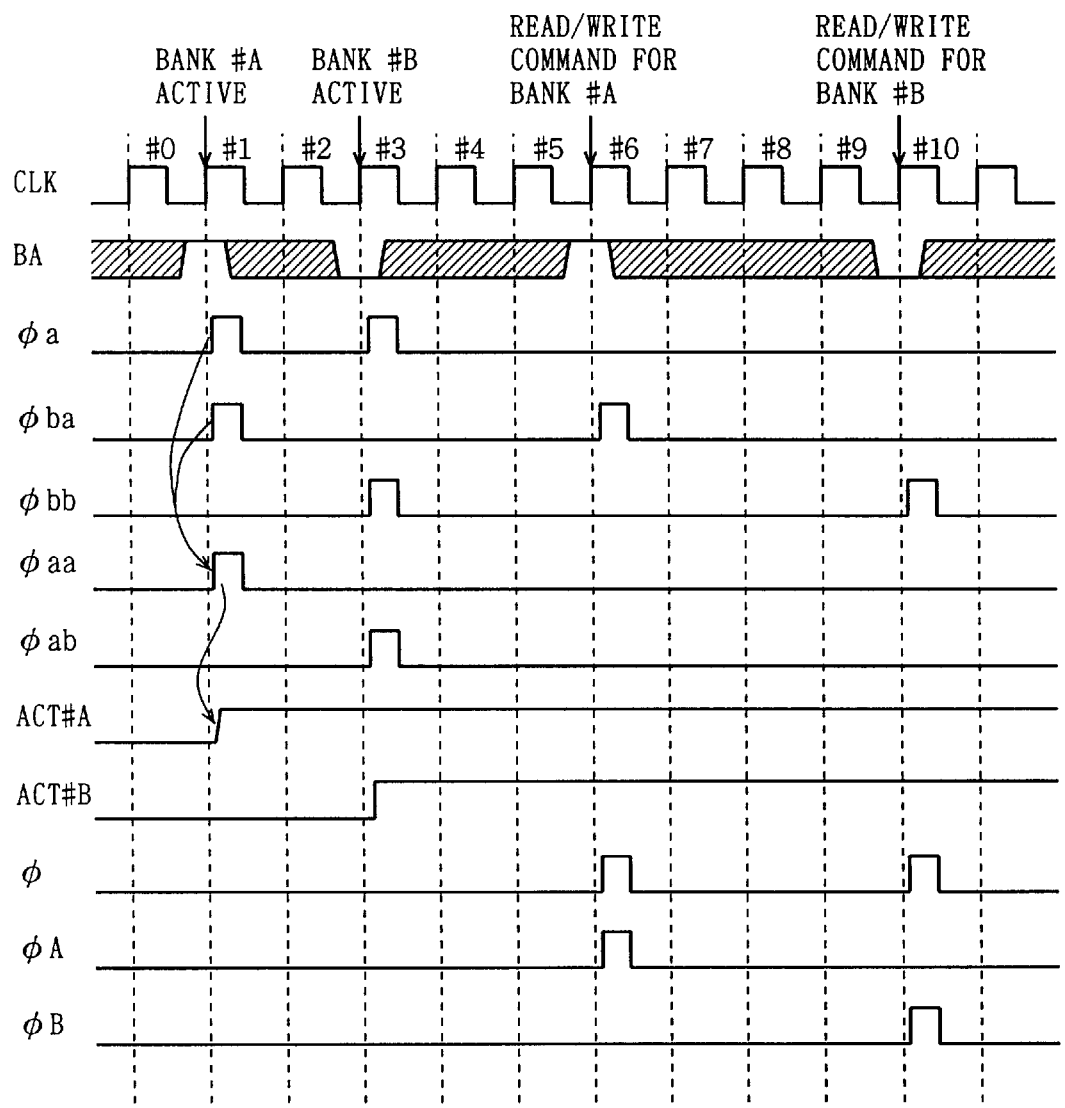

An operation when banks #A and #B are both in the active state will be now described referring to FIG. 14.

In clock cycle #0, banks #A and #B are both in the inactive state.

In clock cycle #1, an active command is supplied for bank #A. Accordingly, array activation signal ACT#A becomes the active state similarly to the operation shown in FIG. 13.

Next, in clock cycle #3, an active command for bank #B is supplied and bank activation signal ACT#B is driven into the active state. Since array activation signals ACT#A and ACT#B are both at the H level, selection signal ZBAS from determining circuit 30b is in the active state at the L level and selection signal BAS is in the active state at the H level. As a result, CMOS transmission gates φab and φbb become conductive in bank deciding circuit 30c, and bank designation signals φba and φbb are supplied to operation mode designation signal generating circuits 30d and 30e.

In clock cycle #6, a command other than the active command (read or write command in FIG. 14) is supplied for bank #A. At this time, bank address signal BA is at the H level, bank #A is designated, and bank designation signal φba is in the active state at the H level for prescribed period. According to the command supplied in clock cycle #6, operation mode instruction signal φ becomes the active state at the H level, operation mode designation signal φA from operation mode designation signal generating circuit 30d accordingly attains the H level, and a designated operation mode is carried out in bank #A.

The command in clock cycle #6 is the one other than the active command and the precharge command, and array activation signals ACT#A and ACT#B are both held in the active state.

In clock cycle #10, a command other than the active command and the precharge command (read or write command) is supplied for bank #B, and bank address signal BA is set at the L level to designate bank #B. In this case, bank designation signal φbb becomes the active state at the H level, and operation mode designation signal φB for bank #B becomes the active state at the H level according to operation mode instruction signal φ which is set to the active state according to the designated operation mode.

If banks #A and #B are both in the active state, an operation mode designation signal is output for a bank designated by bank address signal BA supplied simultaneously with the command. If only one bank is in the active state, an operation mode designation signal is supplied for the bank in the active state. If banks #A and #B are both in the inactive state, selection signal ZBAS attains the H level and bank deciding circuit 30c selects array activation signals ACT#A and ACT#B and supplies them to operation mode designation signal generating circuits 30a and 30e respectively. In this state, array activation signals ACT#A and ACT#B are both at the L level, so that if operation mode instruction signal 100 becomes the active state even when a command other than the active command is erroneously supplied, operation mode designation signals φA and φB maintain the inactive state, and banks #A and #B carry out no operation. Accordingly, consumption of unnecessary power can be prevented.

As described above, if only one bank is in the active state, an operation mode designation signal is automatically supplied for the bank in the active state regardless of the bank address signal when a command other than the active command is supplied. The structure which implements the operation above enables an external controller to have no need of supplying a bank address signal simultaneously with a command, and reduces the load of the controller in selecting a bank.

(Modification 1 of Bank Drive Signal Generating Circuit)

Figure 15:
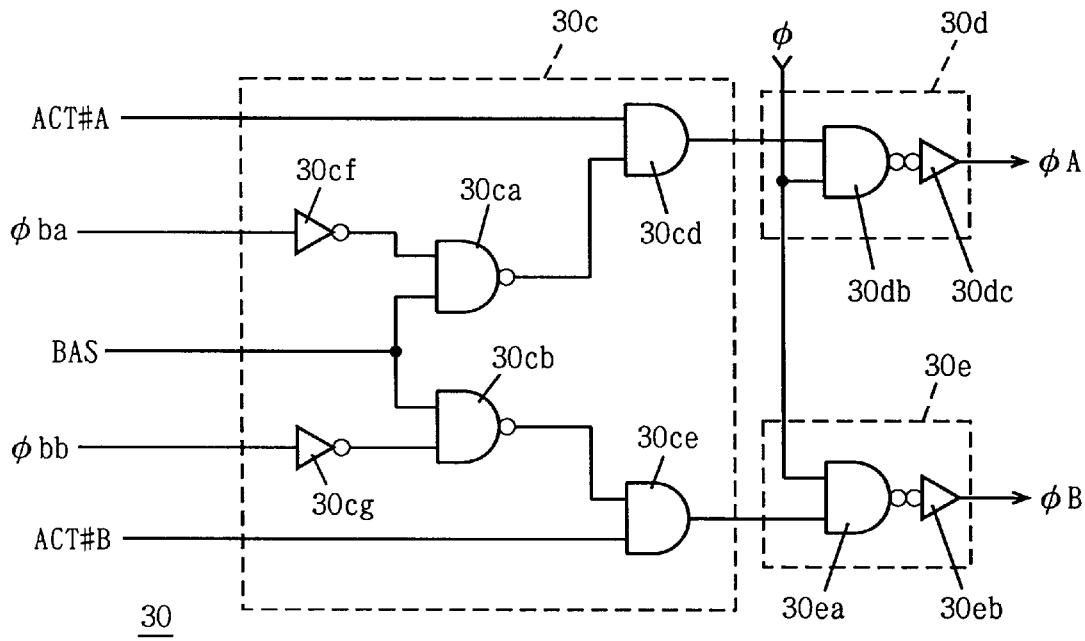
FIGS. 15 and 16 respectively show structures of a first and second modifications of the bank drive signal generating circuit shown in FIG. 11.

FIG. 15 shows a structure of a modification of bank drive signal generating circuit 30 shown in FIG. 11. The structures of bank deciding circuit 30c, operation mode designation signal generating circuits 30d and 30e are shown in FIG. 15. The structure of the determining circuit 30b is similar to that shown in FIG. 12.

Referring to FIG. 15, bank deciding circuit 30c includes: an NAND circuit 30ca which receives selection signal BAS from determining circuit 30b in FIG. 12 and bank designation signal φba supplied via an inverter 30cf; an NAND circuit 30cb which receives selection signal BAS and bank designation signal φbb supplied via an inverter 30cg; an AND circuit 30cd which receives array activation signal ACT#A and a signal output from NAND circuit 30ca; and an AND circuit 30ce which receives a signal output from NAND circuit 30cb and array activation signal ACT#B.

Operation mode designation signal generating circuit 30d includes an NAND circuit 30db which receives operation mode instruction signal φ and a signal output from AND circuit 30cd, and an inverter 30ec which receives a signal output from NAND circuit 30db and outputs operation mode designation signal φA. Operation mode designation signal generating circuit 30e includes an NAND circuit 30ea which receives operation mode instruction signal φ and a signal output from AND circuit 30ce, and an inverter 30eb which receives a signal output from NAND circuit 30ea and outputs operation mode designation signal φB. These operation mode designation signal generating circuits 30d and 30e are respectively equivalent to the AND circuits substantially, and have structures equivalent to those shown in FIG. 12.

In the structure shown in FIG. 15, a logic circuit is used instead of the CMOS transmission gate. If array activation signals ACT#A and ACT#B are both in the active state at the H level, selection signal BAS is in the active state at the H level (see FIG. 12) and NAND circuits 30ca and 30cb operate as inverters. If bank designation signal φba attains the H level, the signal output from inverter 30cf becomes the L level, the signal output from NAND circuit 30ca becomes the H level, and the signal output from AND circuit 30cb accordingly attains the H level. As a result, operation mode designation signal φA attains the H level in the active state according to operation mode instruction signal φ.

If at least one bank is in the inactive state, selection signal BAS becomes the L level and the signals output from NAND circuits 30ca and 30cb are fixed at the H level. In this state, the logic levels of the output signals from AND circuits 30cd and 30ce are decided according to the states of array activation signals ACT#A and ACT#B regardless of the states of bank designation signals φba and φbb. If array activation signal ACT#A is in the active state, the signal output from AND circuit 30cd attains the H level so that operation mode designation signal φA is driven into the active state according to operation mode instruction signal φ. If array activation signal ACT#B is at the H level in the active state, the signal output from AND circuit 30ce attains the H level so that operation mode designation signal φB is driven into the active state according to operation mode instruction signal φ. If array activation signals ACT#A and ACT#B are both in the inactive state, the signals output from AND circuits 30cd and 30ce are both in the inactive state at the L level so that operation mode designation signals φA and φB are held in the inactive state at the L level.

As shown in FIG. 15, even though the bank deciding circuit is constituted of the logic gates, when only one bank is in the active state, the operation mode designation signal can be supplied to the bank in the active state regardless of the state of the bank address signal.

(Modification 2 of Bank Drive Signal Generating Circuit)

Figure 16:
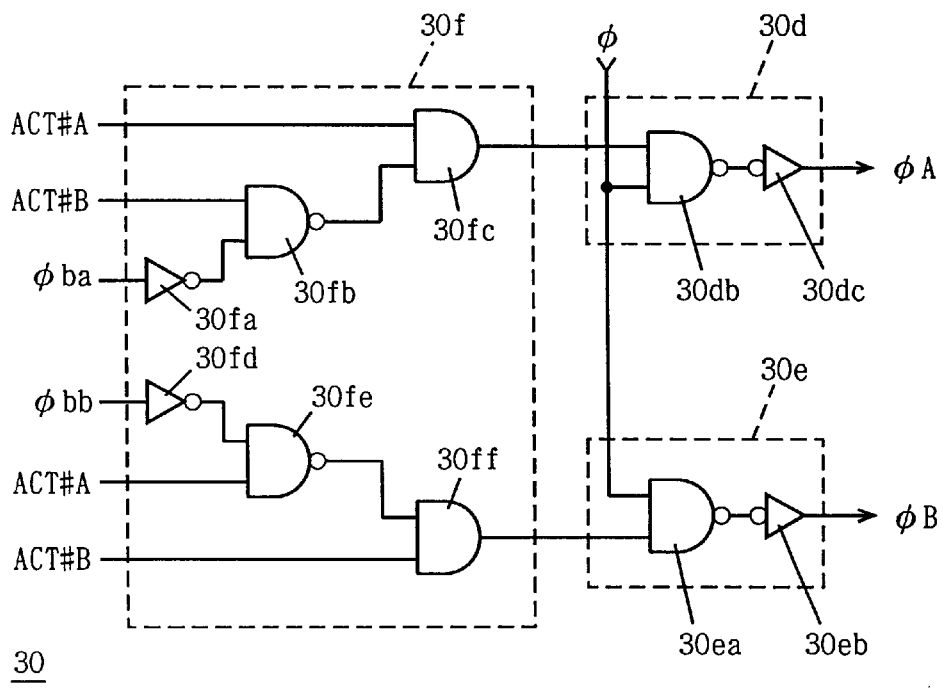

FIG. 16 shows a structure of the modification 2 of bank drive signal generating circuit 30 shown in FIG. 1. Bank drive signal generating circuit 30 shown in FIG. 16 also outputs operation mode designation signals φA and φB according to a command other than the active command. Referring to FIG. 16, bank drive signal generating circuit 30 includes a bank determining/deciding circuit 30f which receives array activation signals ACT#A and ACT#B and bank designation signals φba and φbb, determines whether bank #A and bank #B are both in the active state or not, decides whether bank designation signals φba and φbb are valid/invalid according to the determination, and decides a bank to be selected. Bank drive signal generating circuit 30 further includes operation mode designation signal generating circuits 30d and 30e which output operation mode designation signals φA and φB for banks #A and #B respectively according to a signal output from bank determining/deciding circuit 30f.

Bank determining/deciding circuit 30f includes inverter 30fa receiving bank designation signal φba; an NAND circuit 30fb receiving array activation signal ACT#B and a signal output from inverter 30fa; an AND circuit 30fc receiving array activation signal ACT#A and a signal output from NAND circuit 30fb; an inverter 30fd receiving bank designation signal φbb; an NAND circuit 30fe receiving a signal output from inverter 30fd and array activation signal ACT#A; and an AND circuit 30ff receiving a signal output from NAND circuit 30fe and array activation signal ACT#B.

Operation mode designation signal generating circuit 30d includes an NAND circuit 30db receiving a signal output from AND circuit 30fc and operation mode instruction signal φ, and an inverter 30dc which inverts the signal output from NAND circuit 30db and outputs operation mode designation signal φA. Operation mode designation signal generating circuit 30e includes an NAND circuit 30ea receiving a signal output from AND circuit 30ff and operation mode instruction signal φ, and an inverter 30eb which inverts the signal output from NAND circuit 30ea and outputs operation mode designation signal φB.

If array activation signal ACT#B is at the L level in the inactive state, the signal output from NAND circuit 30fb is fixed at the H level, and AND circuit 30fc operates as a buffer so that a bank designation signal for bank #A is output according to array activation signal ACT#A. If array activation signal ACT#B is in the active state, NAND circuit 30fb operates as an inverter so that a bank designation signal for bank #A is output according to bank designation signal φba and array activation signal ACT#A.

Regarding bank #B, if array activation signal ACT#A is in the active state and bank #A is in the active state, NAND circuit 30fe operates as an inverter so that a bank designation signal for bank #B is output according to bank designation signal φbb and array activation signal ACT#B. If array activation signal ACT#A is at the L level in the inactive state, the signal output from NAND circuit 30fe is fixed at the H level so that the bank designation signal for bank #B is output according to array activation signal ACT#B.

Accordingly, in the structure of the bank determining/deciding circuit shown in FIG. 16, if array activation signals ACT#A and ACT#B are both at the H level in the active state and banks #A and #B are both in the active state, the bank designation signals for banks #A and #B are output according to bank designation signals φba and φbb. If one of array activation signals ACT#A and ACT#B is in the inactive state and the other bank is in the active state, bank designation signal φba or φbb for the bank in the active state is made invalid (don't care), so that the bank designation signal is output according to the array activation signal for the bank in the active state.

If both of array activation signals ACT#A and ACT#B are in the inactive state, signals output from AND circuits 30fc and 30ff are fixed at the L level, operation mode designation signals φA and φB are fixed in the inactive state at the L level, so that the operation mode is not designated.

In the two-bank structure, if one bank is in the active state, the bank designation signal for the other bank is valid and a bank selection signal for the other bank is output according to the valid bank designation signal and the array activation signal for the other bank. Therefore, if a plurality of banks are simultaneously kept in the active state, a bank is selected according to the bank designation signal. If one bank is in the inactive state, the bank designation signal for another bank is made invalid, and the bank selection signal for the other bank is generated according to the array activation signal for the other bank. Accordingly, if only one bank is in the active state, the active bank is always selected.

In the structure shown in FIG. 16, two operations are simultaneously carried out. Specifically, one operation is to determine if a plurality of banks are simultaneously held in the active state or not, and the other operation is to decide if a bank designation signal is valid or invalid according to the determination and to output the bank selection signal for the bank in the active state if only one bank is in the active state.

By employing such a bank determining/deciding circuit as shown in FIG. 16, the bank determining circuit and the bank deciding circuit are not required to be provided separately, and reduction of the signal propagation delay and generation of the bank selection signal at a high speed are enabled.
(Specific Structure of Bank Drive Signal Generating Circuit)

Figure 17:
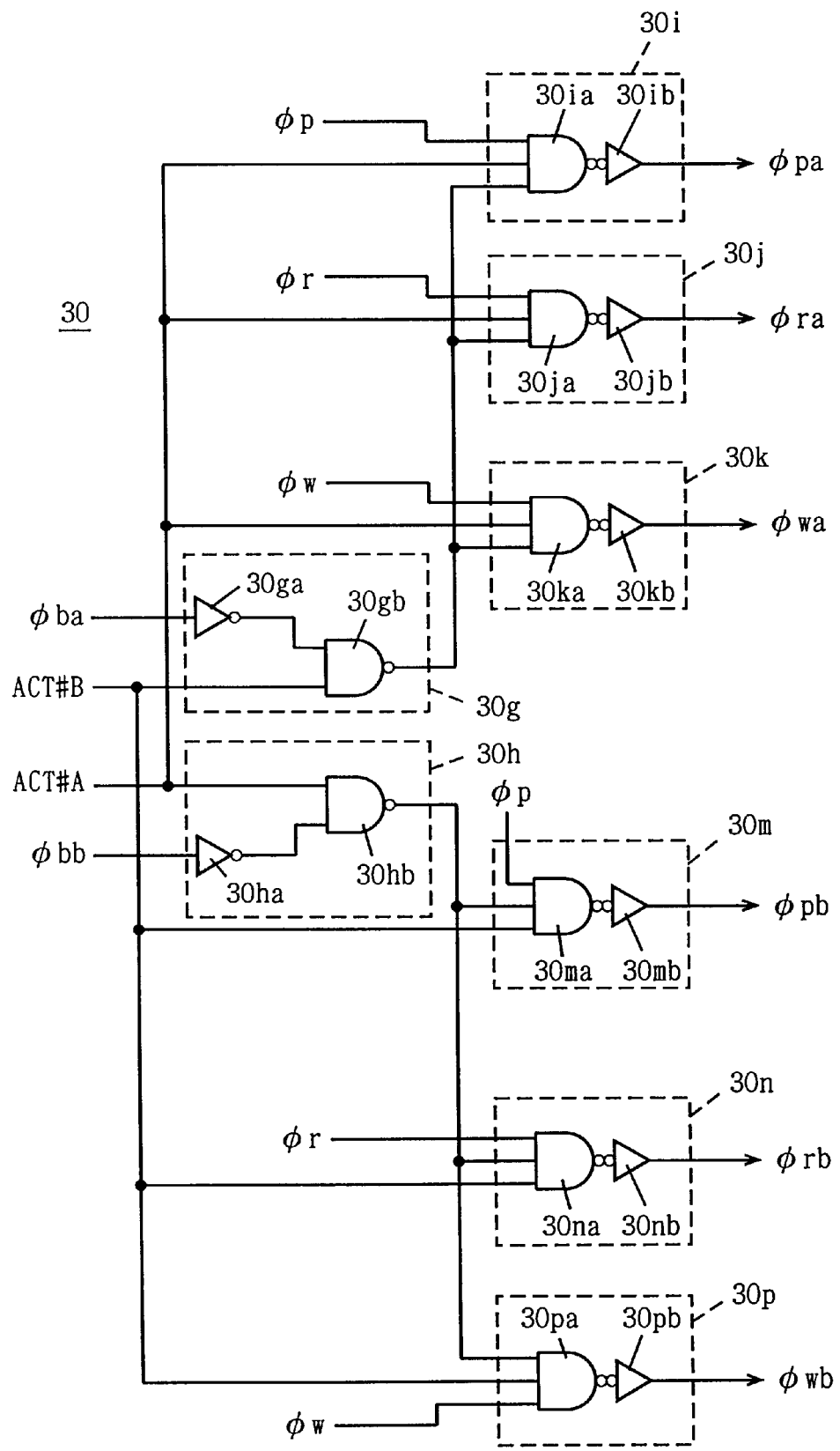
FIG. 17 specifically shows a structure of the bank drive signal generating circuit shown in FIG. 11.

FIG. 17 specifically shows a structure of the bank drive signal generating circuit. Referring to FIG. 17, bank drive signal generating circuit 30 includes: a bank selection control circuit 30g which controls the valid/invalid of bank designation signal φba according to bank designation signal φba and array activation signal ACT#B; a bank selection control circuit 30h which decides if bank designation signal #bb is valid or invalid according to array activation signal ACT#A and bank designation signal φbb; a precharge trigger signal generating circuit 30i which outputs precharge operation designation signal (precharge trigger signal) φpa for bank #A according to a signal output from bank selection control circuit 30g, array activation signal ACT#A and precharge operation instruction signal φp; a read trigger signal generating circuit 30j which outputs read operation trigger signal φra for bank #A according to read operation mode instruction signal φr, array activation signal ACT#A and a signal output from bank selection control circuit 30g; and a write trigger signal generating circuit 30k which outputs write trigger signal φwa designating a data write operation for bank #A according to write operation instruction signal φw, array activation signal ACT#A and a signal output from selection control circuit 30g.

Trigger signal generating circuits 30i, 30j and 30k are enabled if array activation signal ACT#A is in the active state and the signal output from bank selection control circuit 30g is in the active state at the H level, to output a trigger signal designating an operation mode according to the supplied operation mode instruction signal.

Bank drive signal generating circuit 30 further includes: a precharge trigger signal generating circuit 30m which outputs precharge trigger signal φpb designating a precharge operation for bank #B according to precharge operation instruction signal φp, a signal output from bank selection control circuit 30h and array activation signal ACT#B; a read trigger signal generating circuit 30n which outputs read trigger signal φrb designating a data read operation for bank #B according to read operation instruction signal φr, array activation signal ACT#B and a signal output from bank selection control circuit 30h; and a write trigger signal generating circuit 30p which outputs write trigger signal φrb designating a data write operation for bank #B according to write operation mode instruction signal φw, array activation signal ACT#B and a signal output from bank selection control circuit 30h.

Trigger signal generating circuits 30m, 30n and 30p are enabled when the signal output from bank selection control circuit 30h is in the active state at the H level and array activation signal ACT#B is in the active state, to output a corresponding operation mode designation signal (trigger signal) according to the supplied operation mode instruction signal.

Bank selection control circuit 30g includes an inverter 30ga receiving bank designation signal φba, and an NAND circuit 30gb receiving a signal output from inverter 30ga and array activation signal ACT#B. Bank selection control circuit 30h includes an inverter 30ha receiving bank designation signal φbb, and an NAND circuit 30hb receiving a signal output from inverter 30ha and array activation signal ACT#A. Signals for selecting banks are output from NAND circuits 30gb and 30hb respectively. Bank selection control circuits 30g and 30h respectively correspond to the structures of inverters 30fa and NAND circuit 30fb, and inverter 30fd and NAND circuit 30fe shown in FIG. 16.

Precharge trigger signal generating circuit 30i includes a 3-input NAND circuit 30ia receiving precharge instruction signal φp, array activation signal ACT#A and a signal output from NAND circuit 30gb, and an inverter 30ib which inverts a signal output from NAND circuit 30ia and outputs precharge trigger signal φpa for bank #A.

Read trigger signal generating circuit 30j for bank #A includes a 3-input NAND circuit 30ja receiving read operation instruction signal φr, array activation signal ACT#A and a signal output from NAND circuit 30gb, and includes an inverter 30ib which inverts a signal output from NAND circuit 30ja and outputs read trigger signal φra for bank #A.

Write trigger signal generating circuit 30k includes a 3-input NAND circuit 30ka receiving write operation instruction signal φw, array activation signal ACT#A and a signal output from NAND circuit 30gb, and an inverter 30kb which inverts a signal output from NAND circuit 30ka and outputs write trigger signal φwa for bank #A.

Write trigger signal generating circuit 30m for bank Ax #B includes a 3-input NAND circuit 30ma receiving precharge operation instruction signal φp, a signal output from NAND circuit 30hb included in bank selection control circuit 30h and array activation signal ACT#B, and an inverter 30mb which inverts a signal output from NAND circuit 30ma and outputs precharge trigger signal φpb for bank #B.

Read trigger signal generating circuit 30n for bank #B includes a 3-input NAND circuit 30na receiving read operation instruction signal φr, array activation signal ACT#B and a signal output from NAND circuit 30hb, and an inverter 30nb which inverts a signal output from NAND circuit 30na and outputs read trigger signal φrb designating the read operation mode for bank #B.

Write trigger signal generating circuit 30p for bank #B includes a 3-input NAND circuit 30pa receiving a signal output from NAND circuit 30hp, write operation instruction signal φw and array activation signal ACT#B, and an inverter 30pb which inverts a signal output from NAND circuit 30pa and outputs write trigger signal φwb designating the write operation mode for bank #B.

Trigger signal generating circuits 30m, 30n and 30p are enabled if array activation signal ACT#B is in the active state and the signal output from bank selection control circuit 30h is in the active state, to output a corresponding operation mode designation signal (trigger signal) according to the supplied operation mode instruction signal. The structures of trigger signal generating circuits 30i, 30j, 30k, 30m, 30n and 30p correspond to structures of AND circuits 30fc and 30ff, and operation mode designation signal generating circuits 30d and 30e shown in FIG. 16.

In the structure shown in FIG. 17, trigger signal generating circuits 30i–30k and 30m–30p implement partially the function of determining if only a corresponding bank is in the active state or not. If the other bank is in the inactive state, bank selection control circuits 30g and 30h render the bank designation signal ineffective since only a bank corresponding thereto could be in the active state. If the other bank is in the active state, a plurality of banks could be in the active state simultaneously, so that bank selection control circuit 30g and 30h render bank designation signals φba and φbb valid respectively and set the states of the output signals according to bank designation signals φba and φbb.

Referring to the timing charts shown in FIGS. 18 and 19, an operation of the bank drive signal generating circuit shown in FIG. 17 is described below.

Figure 18:
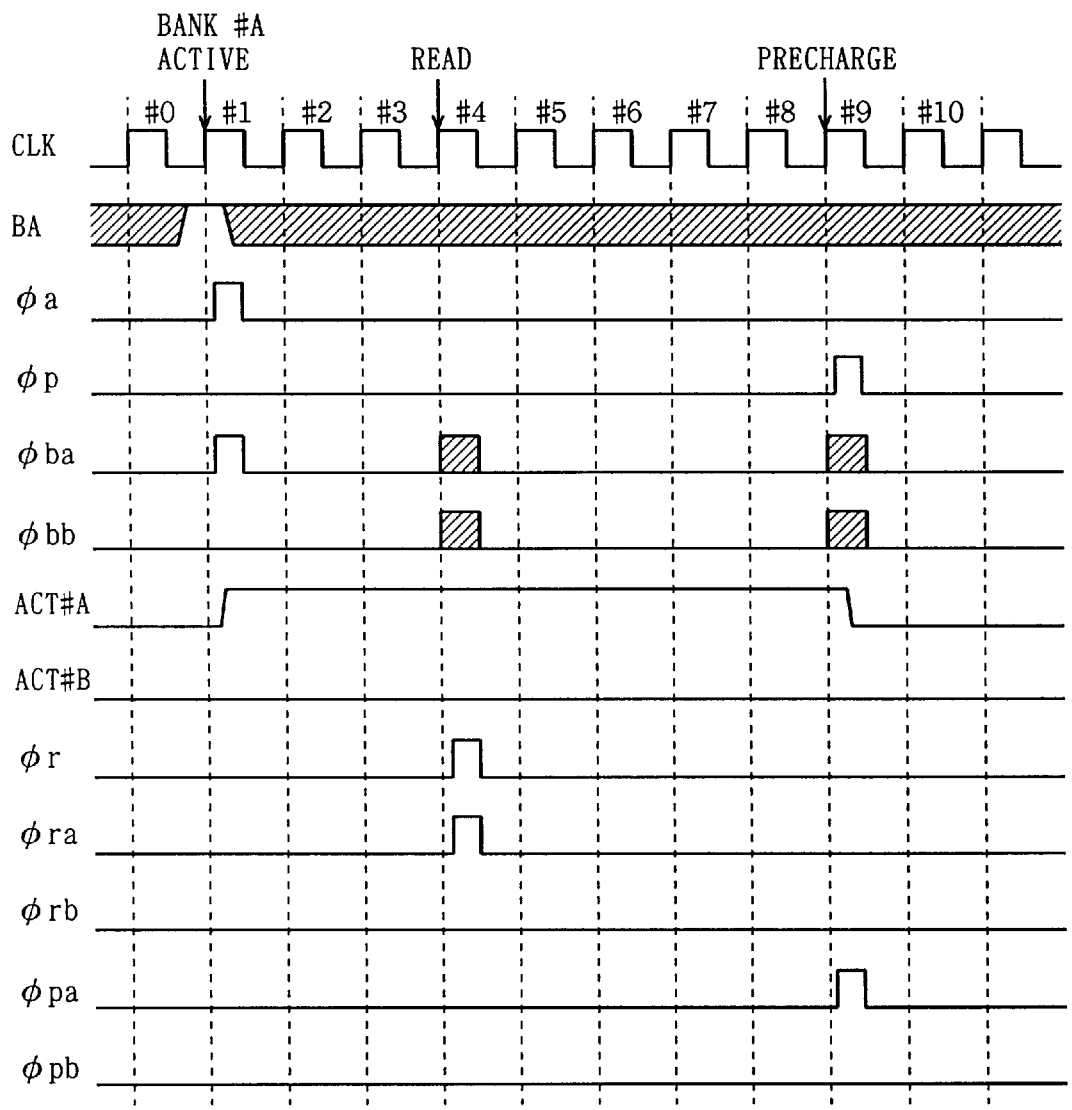
FIGS. 18 and 19 are timing charts representing operations of the bank drive signal generating circuit shown in FIG. 17.

First with reference to FIG. 18, an operation carried out if the read command is supplied when only one bank is driven into the active state is described.

In clock cycle #0, banks #A and #B are both in the inactive state, and array activation signals ACT#A and ACT#B are both in the inactive state at the L level. In this state, signals output from bank selection control circuits 30g and 30h are at the H level. However, since trigger signal generating circuits 30i–30k and 30m–30p supply array activation signals ACT#A and ACT#B respectively, the trigger signals are all in the inactive state at the L level.

In clock cycle #1, bank address signal BA is set at the H level and an active command is supplied. Bank activation instruction signal φa is in the active state at the H level for a prescribed period, and bank designation signal φba is in the active state at the H level for a prescribed period. Accordingly, array activation signal ACT#A for bank #A is driven into the active state at the H level as apparent from the structure shown in FIG. 10.

In clock cycle #4, a read command is supplied. In this case, array activation signal ACT#A is in the active state at the H level and array activation signal ACT#B is in the inactive state at the L level. As a result, trigger signals from trigger signal generating circuits 30m–30p for bank #B are all held in the inactive state at the L level. In bank selection control circuit 30g, the signal output therefrom is at the H level and array activation signal ACT#A is in the active state at the H level, so that trigger signal generating circuits 30i–30k for bank #A are all enabled. As a result, if the read command is supplied and read operation instruction signal φr is driven into the active state at the H level for a prescribed period, read trigger signal φra from read trigger signal generating circuit 30j is in the active state at the H level for a prescribed period and a data read mode for bank #A is designated. In clock cycle #4, the state of bank address signal BA is arbitrary, and the states of bank designation signals φba and φbb are also arbitrary. Regardless of the state of bank address signal BA, only the trigger signal generating circuit for bank #A is enabled.

In clock cycle #9, a precharge command is supplied. The state of bank address signal BA is also arbitrary. According to the precharge command, precharge instruction signal φp is in the active state at the H level for a prescribed period. In clock cycle #9, the signal output from bank selection control circuit 30g is at the H level, array activation signal ACT#A is also at the H level, and only trigger signal generating circuits 30i–30k for bank #A are enabled. Accordingly, if precharge instruction signal φp is in the active state at the H level for a prescribed period according to the precharge command, precharge trigger signal φpa from precharge trigger signal generating circuit 30i is in the active state at the H level for a prescribed period so that array activation signal ACT#A is driven into the inactive state at the L level according to the structure shown in FIG. 6. In cycle #9, the state of bank address signal BA is also arbitrary.

As described above, if only one bank is in the active state, an operation mode according to a command is designated for the bank in the active state. In and after clock cycle #10, banks #A and #B are in the inactive state again, and are in the state of waiting for next command input.

Figure 19:
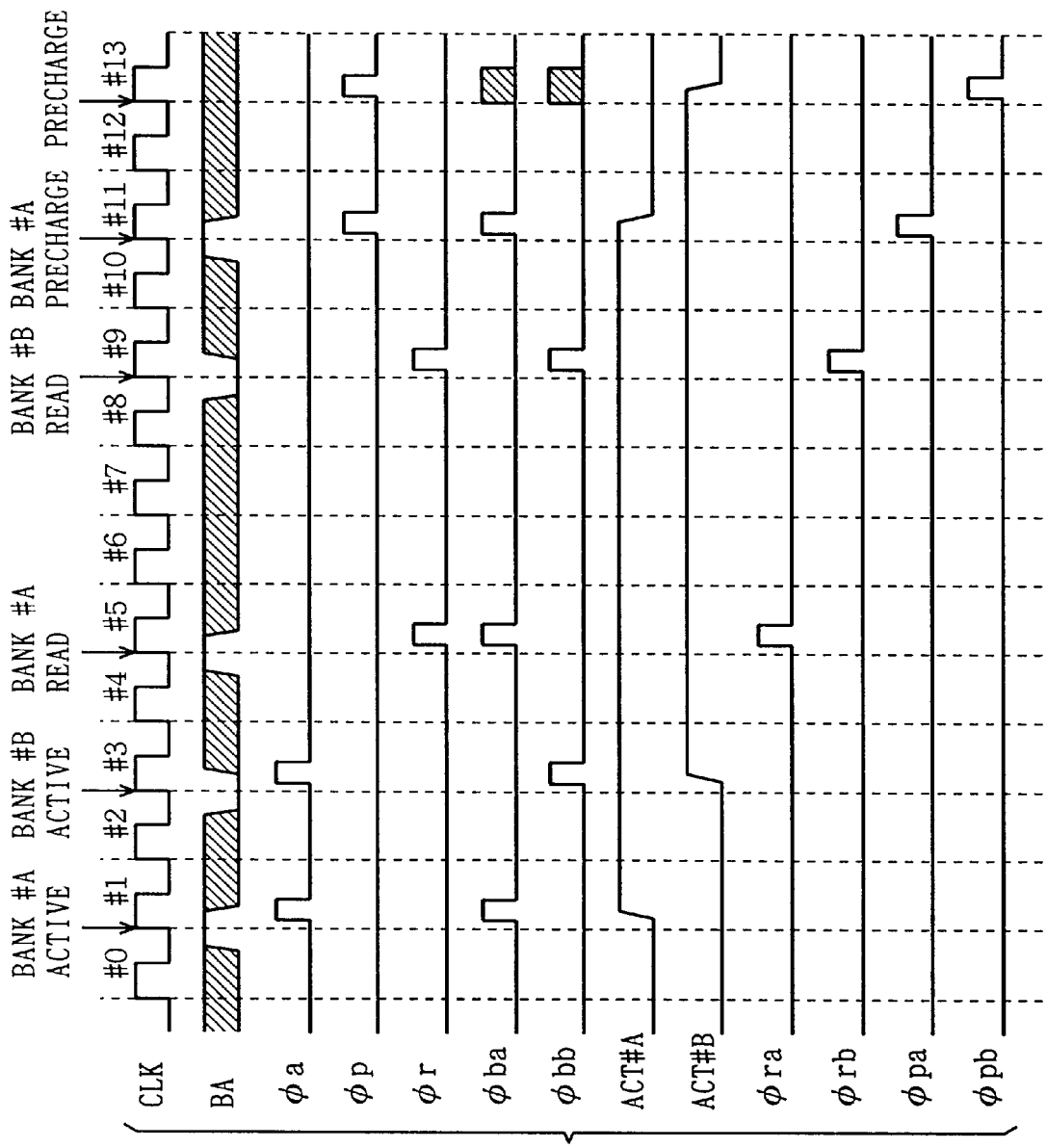

Referring to FIG. 19 next, an operation carried out when banks #A and #B are simultaneously driven into the active state is described.

In clock cycle #0, both banks #A and #B are in the inactive state. In clock cycle #1, bank address signal BA is set at the H level and an active command is supplied. Accordingly, bank activation instruction signal φA is in the active state at the H level for a prescribed period, array activation instruction signal φba for bank #A is in the H level for a prescribed period and array activation signal ACT#A for bank #A is accordingly driven into the active state at the H level.

In clock cycle #3, bank address signal BA is set at the L level and an active command is supplied. In the state in which bank address signal BA is at the L level, bank #B is designated. Bank activation instruction signal φa is activated and bank designation signal φbb is driven into the active state at the H level for a prescribed period. Accordingly, array activation signal ACT#B for bank #B is driven into the active state. In clock cycle #3, array activation signals ACT#A and ACT#B are both in the active state at the H level. In this state, signals output from bank selection control circuits 30g and 30h are decided by bank designation signals φba and φbb (since NAND circuits 30ga and 30hb operate as inverters).

In clock cycle #5, bank address signal BA is set at the H level and a read command is supplied. According to bank address signal BA at the H level, bank designation signal φba is at the H level for a prescribed period and read operation instruction signal φr is at the H level for a prescribed period according to the read command. As a result, a signal output from bank selection control circuit 30g attains the H level and trigger signal generating circuits 30i–30k for bank #A are enabled. According to read operation instruction signal φr, read trigger signal generating circuit 30j drives read trigger signal φra designating the read operation mode for bank #A into the active state. For bank #B, since bank designation signal φbb is at the L level, trigger signal generating circuits 30m–30p are all in the inactive state. In bank #A, the data read operation is carried out.

Next, in clock cycle #9, bank address signal BA is set at the L level and a read command is supplied. According to bank address signal BA at the L level, bank designation signal φbb is in the active state at the H level for a prescribed period and a signal output from bank selection control circuit 30h attains the H level accordingly, so that trigger signal generating circuits 30m–30p for bank #B are enabled. According to the read command, read operation instruction signal φr is driven into the active state at the H level for a prescribed period, read trigger signal φrb from read trigger signal generating circuit 30n is in the active state at the H level for a prescribed period, and the data read mode for bank #B is designated.

While data is read out in bank #B, in clock cycle #11, bank address signal BA is set at the H level and a precharge command is supplied. As a result, precharge instruction signal φp and bank designation signal φba are in the active state at the H level for a prescribed period, precharge trigger signal φpa from precharge trigger signal generating circuit 30i is at the H level for a prescribed period, and the precharge operation mode for bank #A is designated. According to activation of precharge trigger signal φpa, array activation signal ACT#A is driven into the inactive state at the L level.

If array activation signal ACT#A becomes the inactive state at the L level, a signal output from bank selection control circuit 30h is held at the H level regardless of the state of the bank designation signal φbb, and trigger signal generating circuits 30m–30p for bank #B are enabled.

In clock cycle #13, data reading in bank #B completes and a precharge command is supplied. At this time, bank address signal BA is in an arbitrary state (since only one bank is held in the active state). According to the precharge command, precharge instruction signal φp is driven into the H level for a prescribed period. Since array activation signal ACT#A is in the inactive state at the L level and array activation signal ACT#B is in the active state at the H level, precharge trigger signal generating circuit 30m for bank #B is enabled, precharge trigger signal φpb for bank #B is driven into the active state at the H level for a prescribed period and array activation signal ACT#B is accordingly driven into the inactive state at the L level, regardless of the states of bank designation signals φba and φbb.

As described above, in the operation mode in which two banks are simultaneously in the active state, a bank for which an operation according to a command is carried out is designated by externally supplied bank address signal BA. Therefore, bank address signal BA may be set at the L level and bank #B may be designated in clock cycle #13 in order to constantly hold the address designation manner in this operation mode.

The description above relates to the data reading operation. However, if the write command is supplied, whether the bank designation signal is valid or invalid is selectively determined depending on whether bank #A and bank #B are simultaneously being activated or not, and the write operation mode is designated.

Figure 20:
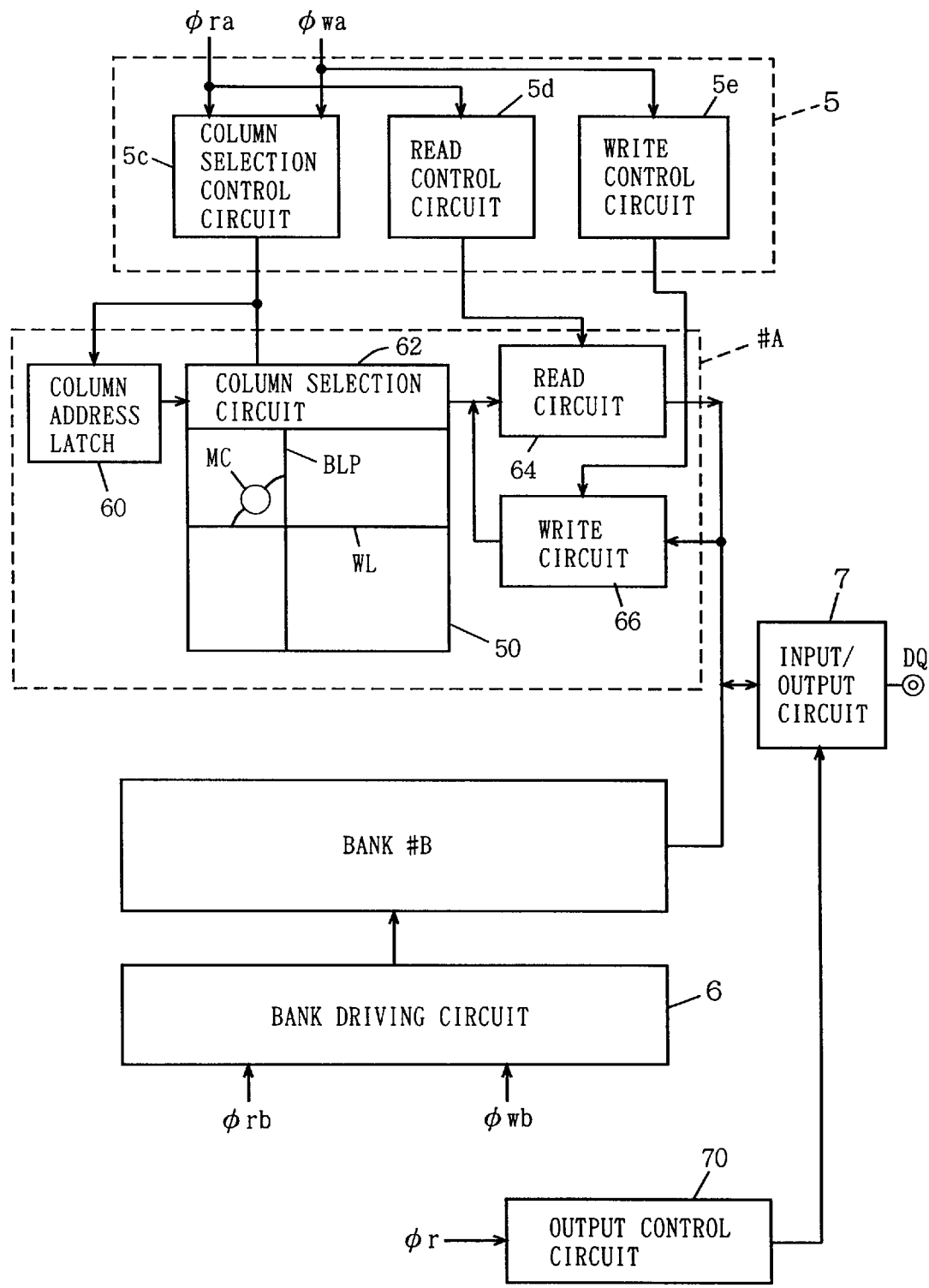
FIG. 20 schematically shows a structure of a portion related to data write/read in the semiconductor memory device shown in FIG. 1.

FIG. 20 schematically shows a structure of the bank driving circuit of the semiconductor memory device shown in FIG. 1 and a portion related to data writing/reading (column-related circuit) of the bank. Banks #A and #B have the same structure and bank driving circuit 5 for bank #A and bank driving circuit 6 for bank #B have the same structure, so that structures of bank #A and bank driving circuit 5 only are shown in FIG. 20.

Bank driving circuit 5 includes: a column selection control circuit 5c responsive to activation of one of read trigger signal φra and write trigger signal φwa to control a column selecting operation in memory cell array 50 of bank #A; a read control circuit 5d activated responsive to activation of read trigger signal φra to control the operations necessary for data reading according to a prescribed sequence; and a write control circuit 5e responsive to activation of write trigger signal φwa to control the operations necessary for data writing. Read control circuit 5d and write control circuit 5e have burst length counters therein and control the operations such that data of the burst length are read and written when read trigger signal φra and write trigger signal φwa are in the active state, respectively. Read control circuit 5a further has a CAS latency counter and controls the operation such that a valid effective data is output after the CAS latency has passed.

Bank #A includes: a column address latch 60 which is activated under the control of column selection control circuit 5c to latch a column address signal supplied from an address signal input buffer (not shown); a column selecting circuit 62 which is activated under control of column selection control circuit 5c, to select a column in memory cell array 50; read circuit 64 which is activated under control of read control circuit 5d, to read memory cell data appearing on a column selected by column selecting circuit 62, for supplying the read data to an input/output circuit 7; and write circuit 66 which is activated under control of write control circuit 5e, to transmit data supplied from input/output circuit 7 onto a column selected by column selecting circuit 62.

Column selecting circuit 62 includes: a column decoder which decodes an internal column address signal supplied from column address latch 60; a column selecting gate (IO gate) which connects a selected column in memory cell array 50 to an internal data bus according to a signal output from the column decoder; and a burst address counter which generates column address signals sequentially with a column address signal latched by column address latch 60 as a leading address in a prescribed sequence, under control of column selection control circuit 5c.

Read circuit 64 includes a preamplifier which is activated under control of read control circuit 5d and amplifies data in a memory cell selected by column selecting circuit 62, and a transfer circuit which transmits the data amplified by the preamplifier sequentially to input/output circuit 7. Write circuit 66 includes a write driver receiving data sequentially supplied from input/output circuit 7 for writing the transferred write data into a selected memory cell when activated.

The read circuit and the write circuit in bank #B are also also commonly coupled to input/output circuit 7. Bank driving circuit 6 has a structure similar to that of bank driving circuit 5, and makes the controls in a similar sequence according to activation of read trigger signal φrb and write trigger signal φwb.

Input/output circuit 7 is provided with an output control circuit 70 which activates an output buffer circuit included in input/output circuit 7 for a period of the burst length after the CAS latency has passed according to activation of read operation instruction signal φr. An input circuit included in input/output circuit 7 is enabled when the bank activation instruction signal (active command) is supplied since the data applied when the write command is supplied should be taken in.

As shown in FIG. 20, a designated operation mode is carried out in a selected bank according to read trigger signals φra and φrb and write trigger signals φwa and φwb.

According to the first embodiment of the invention, if only one of the two banks is in the active state, an operation mode designation signal is supplied to the bank in the active state. As a result, there is no need to supply a bank address signal simultaneously with supply of a command different from the active command, and control for bank designation is simplified.

(Second Embodiment)

Figure 21:
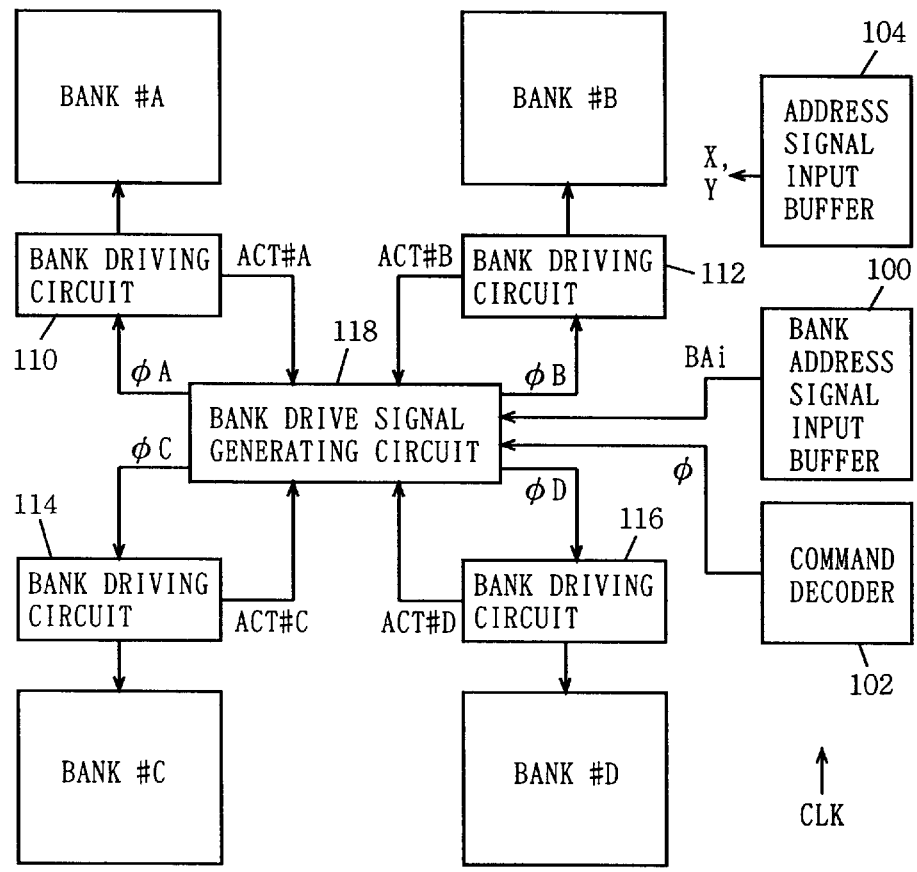
FIG. 21 schematically shows an entire structure of a semiconductor memory device according to the second embodiment of the invention.

FIG. 21 schematically shows an entire structure of a semiconductor memory device according to the second embodiment of the invention. As shown in FIG. 21, four banks #A, #B, #C and #D are provided. For these banks #A, #B, #C and #D, a bank address signal input buffer 100 which receives a bank address signal designating a bank and generates an internal bank address signal, a command decoder 102 which receives a command designating an operation mode to be carried out and outputs internal operation mode instruction signal φ, and an address signal input buffer 104 which receives an address signal designating a location of a selected memory and generates internal row and column address signals X and Y are provided. Command decoder 102 has a structure similar to that according to the first embodiment, determines an operation mode designated according to a combination of the states of external control signals ZRAS, ZCAS and ZWE (not shown) at the rising edge of clock signal CLK, and outputs operation mode instruction signal φ instructing an operation mode instructed according to the determination. Bank address signal input buffer 100 receives a 2-bit bank address signal and generates complimentary internal bank address signals. The 2-bit bank address signal designates one bank. Address signal input buffer 104 has a structure similar to that according to the first embodiment.

The semiconductor memory device further includes bank driving circuits 110, 112, 114 and 116 provided corresponding to banks #A–#D respectively for driving corresponding banks, and a bank drive signal generating circuit 118 which generates operation mode designation signals φA, φB, φC and φD each designating an operation mode and supplies them respectively to bank driving circuits 110, 112, 114 and 116 for a designated bank according to internal bank address signal BAi from bank address signal input buffer 100 and operation mode instruction signal φ from command decoder 102.

Bank drive signal generating circuit 118 receives array activation signals ACT#A, ACT#B, ACT#C and ACT#D from bank driving circuits 110, 112, 114 and 116, and outputs an operation mode designation signal for an addressed bank according to a bank address signal when a plurality of banks are simultaneously in the active state. Bank drive signal generating circuit 118 outputs an operation mode designation signal according to an operation mode instruction signal for a bank which is only the one in the active state.

Figure 22:
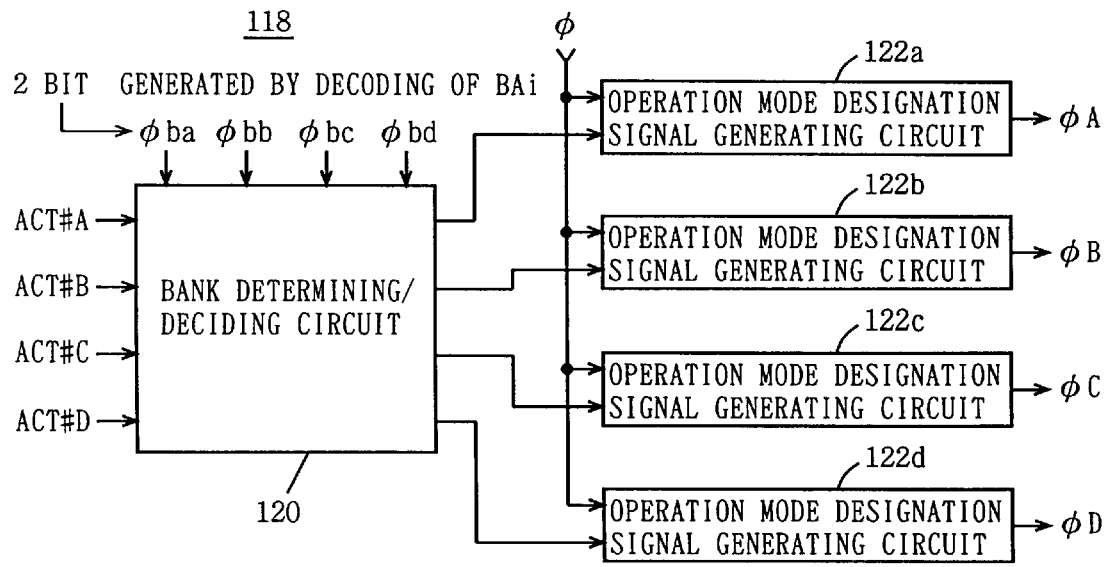
FIG. 22 schematically shows a structure of a bank drive signal generating circuit shown in FIG. 21.

FIG. 22 schematically shows a structure of bank drive signal generating circuit 118 shown in FIG. 21. Referring to FIG. 22, bank drive signal generating circuit 118 includes a bank determining/deciding circuit 120 which receives bank designation signals φba, φbb, φbc and φbd as well as array activation signals ACT#A, ACT#B, ACT#C and ACT#D, determines if a plurality of banks are in the active state, and decides if a bank designation signal is rendered valid or invalid according to the result of the determination, and operation mode designation signal generating circuits 122a, 122b, 122c and 122d which are are selectively activated according to an output signal from bank determining/deciding circuit 120 and outputs operation mode designation signals φA, φB, φC and φD designating an operation mode instructed according to operation mode instruction signal φ when activated. Bank determining/deciding circuit 120 activates, if only one bank is in the active state, an operation mode designation signal generating circuit provided corresponding to the bank in the active state. If a plurality of banks are in the active state, bank determining/deciding circuit 120 activates an operation mode designation signal generating circuit provided corresponding to a bank designated by a bank designation signal.

Figure 23:
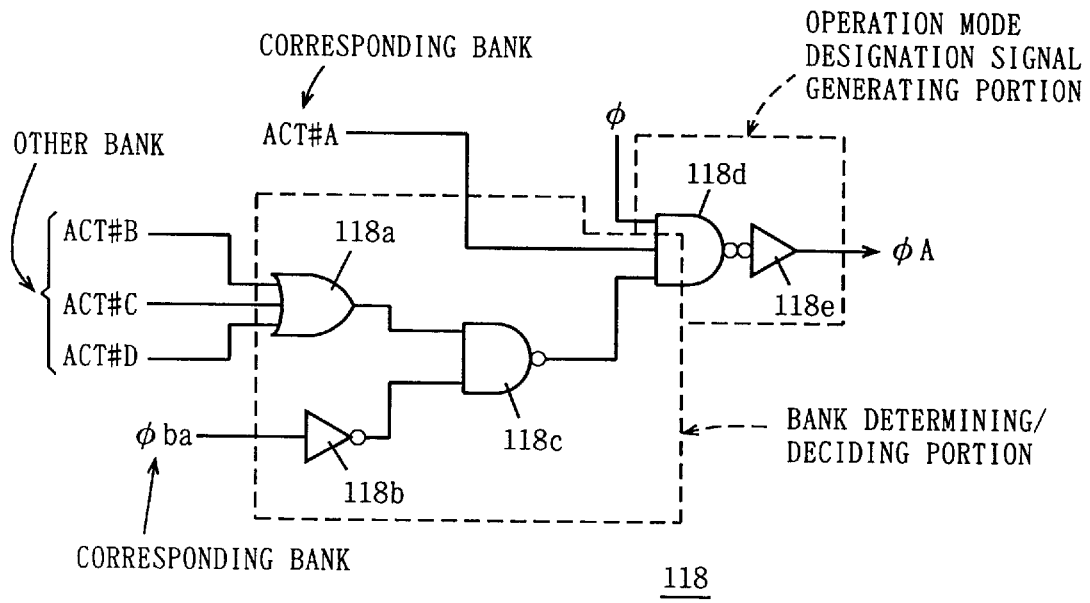
FIG. 23 shows one example of a structure of a bank drive signal generating circuit shown in FIG. 22.

FIG. 23 shows one example of a structure of a portion for bank #A in bank drive signal generating circuit 118 shown in FIG. 21. Similar structures are provided for banks #B–#D.

Referring to FIG. 23, bank drive signal generating circuit 118 includes: an OR circuit 118a receiving bank activation signals ACT#B, ACT#C and ACT#D; an inverter 118b receiving bank designation signal φba; an NAND circuit 118c receiving a signal output from OR circuit 118a and a signal output from inverter 118b; a 3-input NAND circuit 118d receiving a signal output from NAND circuit 118c, array activation signal ACT#A and operation mode instruction signal φ; and an inverter 118e which inverts a signal output from NAND circuit 118d to output operation mode designation signal φA. Bank designation signal φba rises to the H level in the active state for a prescribed period when bank #A is designated.

In the structure shown in FIG. 23, OR circuit 118a, inverter 118b, NAND circuit 118c and a part of NAND circuit 118d correspond to the bank determining/deciding portion in FIG. 22, and a part of NAND circuit 118d and inverter 118e correspond to the operation mode designation signal generating portion shown in FIG. 22. NAND circuit 118d is enabled if both of array activation signal ACT#A and a signal output from NAND circuit 118c are at the H level, and outputs operation mode designation signal φA via inverter 118e according to operation mode instruction signal φ.

Inverter 118b, OR circuit 118a and NAND circuit 118c decides if bank designation signal φba for bank #A is valid or invalid. Now, with reference to the timing chart shown in FIG. 24, an operation of bank drive signal generating circuit 118 shown in FIG. 23 is described.

In clock cycle #a, an active command is supplied and bank address signal BA is set to a state designating bank #A. When the active command is supplied, the array activation signal for a bank addressed according to the bank address signal is driven into the active state regardless of the states of the other banks. Accordingly, array activation signal ACT#A is driven into the active state at the H level in clock cycle #a.

Suppose that a signal output from OR circuit 118a is at the H level, at least one of array activation signals AACT#B, ACT#C and ACT#D is in the active state at the H level, and at least one of other banks is in the active state. In this state, bank #A and at least one other bank are in the active state and a plurality of banks are simultaneously in the active state.

Figure 24:
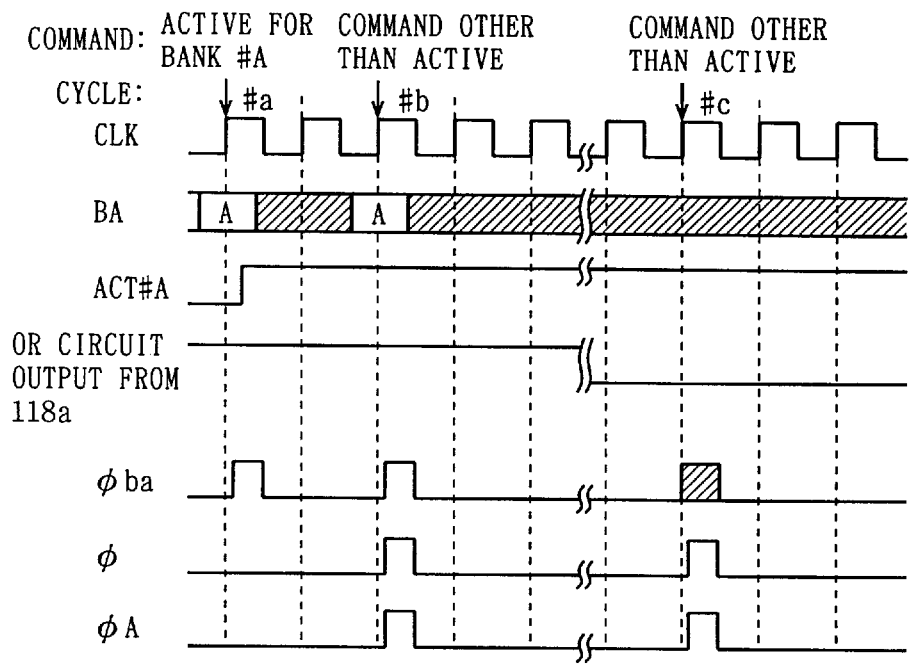
FIG. 24 is a timing chart representing an operation of the bank drive signal generating circuit shown in FIG. 23.
Figure 2:
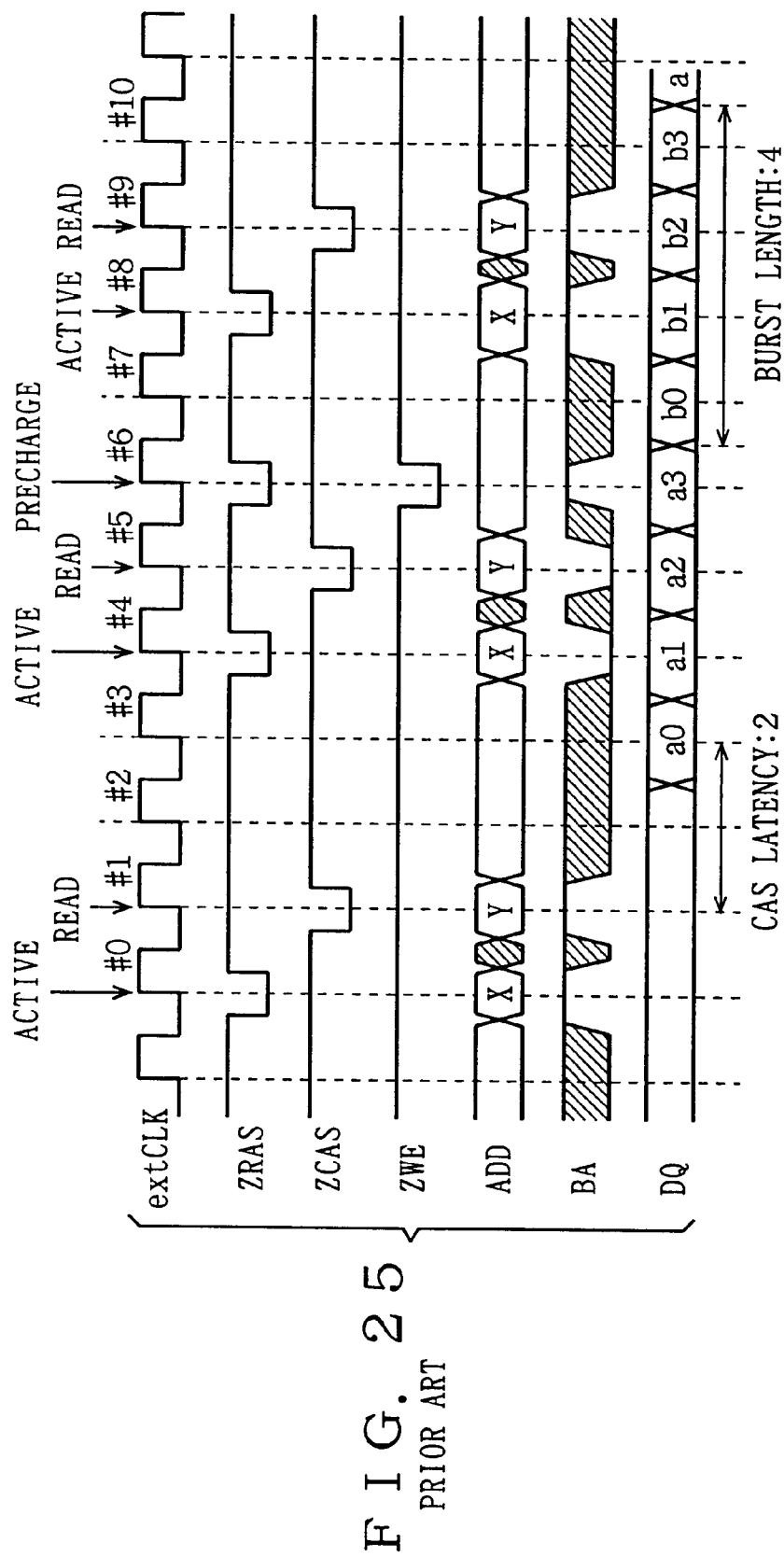
Figure 2:
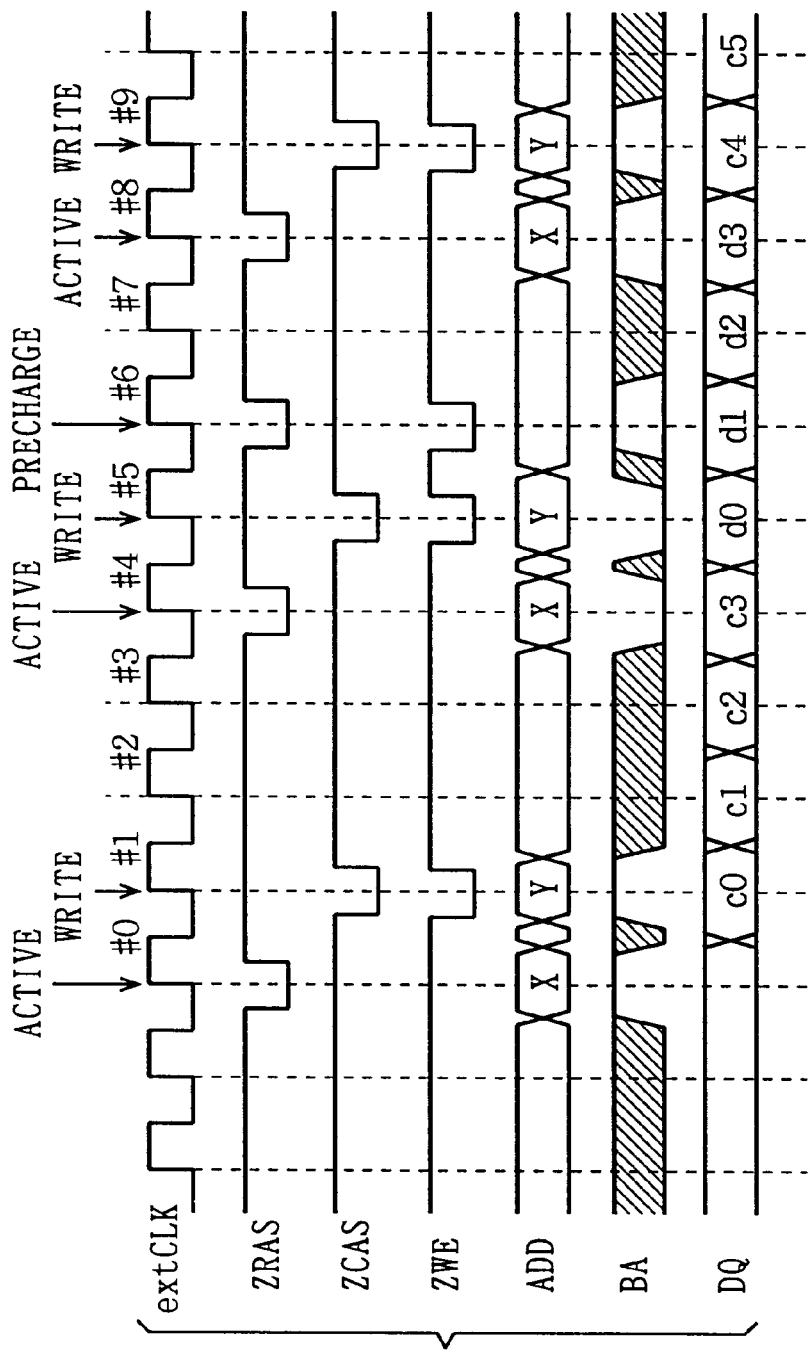

In clock cycle #b, bank address signal BA is set to a state designating bank #A and a command other than the active command is supplied. According to bank address signal BA, bank designation signal φba is in the active state at the H level for a prescribed period and operation mode instruction signal φ is in the active state at the H level for a prescribed period according to the supplied command. A signal output from OR circuit 118a is at the H level so that a signal output from NAND circuit 118c rises to the H level according to activation of bank designation signal φba. Accordingly, NAND circuit 118d is enabled and operation mode designation signal φA for bank #A is output according to operation mode instruction signal φ. FIG. 24 shows a case in which the command supplied in clock cycle #b is a command other than the active command. If a precharge command is supplied in clock cycle #b, array activation signal ACT#A is driven to the L level in the inactive state.

Next, a case in which a signal output from OR circuit 118a falls to the L level is described. In this state, array activation signals ACT#B, ACT#C and ACT#D are all in the inactive state at the L level, and other banks are all in the inactive state. If array activation signal ACT#A is in the active state, only bank #A is in the active state.

In clock cycle #c, a command other than the active command is supplied. A signal output from OR circuit 118a is at the L level and a signal output from NAND circuit 118c is held at the H level regardless of the logic state of bank designation signal φba. If array activation signal ACT#A is in the active state at the H level, NAND circuit 118d is enabled. If operation mode instruction signal φ is in the active state at the H level for a prescribed period according to the command supplied in clock cycle #c, operation mode designation signal φA for bank #A is driven into the active state at the H level for a prescribed period by NAND circuit 118d and inverter 118e.

In this case, if bank #A only is in the active state, there is no need to set bank address signal BA for bank #A, and the state of the bank address signal is arbitrary. In the structure having four banks, if only one bank is in the active state, an operation mode designation signal is supplied for the bank in the active state. Even in the four-bank structure, there is no need to set the bank address signal to a state designating a bank in the active state simultaneously with the supply of the command other than the active command, and control of the bank address signal is simplified as in the first embodiment.

As hereto for described, the semiconductor memory device including four banks in the second embodiment of the invention is structured as follows. If only one bank is in the active state, an operation mode designation signal is supplied for the bank in the active state. As a result, easier control for designating a bank is implemented.

(Other Applications)

Although the number of banks in the description above is two or four, the number of banks is arbitrary. In the structure shown in FIG. 23, by using a structure in which whether a bank address designation signal supplied to a corresponding bank is valid/invalid is determined according to the state of array activation signals for other banks and an array activation signal for a corresponding bank, and whether a corresponding operation mode designation signal has to be made active or inactive is determined according to the result of the previous determination, the structure of the present invention can be applied to a multi-bank semiconductor memory device easily.

In the first and second embodiments above, a synchronous semiconductor memory device which takes an externally supplied signal at the rising edge of the clock signal is described. However, the present invention is applicable to a synchronous semiconductor memory device which takes the externally supplied signal at both the rising edge and the falling edge of the clock signal.

The present invention is also applicable to a semiconductor memory device having a multi-bank structure to which an operation mode instruction signal and a bank address signal are externally supplied even if the semiconductor memory device is not the synchronous type. (The command decoder is unnecessary.)

According to the present invention, the semiconductor memory device having a plurality of banks is structured such that if only one bank is in the active state, the operation mode designation signal for the active bank is driven to the active state regardless of the state of the bank address signal. As a result, the bank address signal is not needed to be set when the operation mode instruction signal is supplied and an easier control of the bank address signal is achieved. Further, there is no need to drive the bank address signal into a prescribed state when a command is supplied, and charging and discharging of a bank address signal transmission line are not carried out, resulting in reduction of the consumed current of the entire system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of banks that can be activated and inactivated independently of each other, comprising:

a plurality of bank driving means provided corresponding to said plurality of banks respectively for driving a corresponding bank according to an operation mode designation signal; and drive signal generating means coupled to said plurality of bank driving means for determining if each of said plurality of banks is in the active state, and outputting, if a result of the determination indicates that one of said plurality of banks is in the active state, the operation mode designation signal corresponding to an operation mode instruction signal to the bank in the active state.

2. The semiconductor memory device according to claim 1, wherein:

said drive signal generating means includes:

gate means provided corresponding to each of said plurality of banks respectively for receiving a bank activation signal indicating an active or inactive state of a bank;

bank selecting means provided corresponding to each of said plurality of banks for holding a bank designation signal designating the corresponding bank in the active state when a signal output from a corresponding gate means indicates that no bank activation signal received by the corresponding gate means is in the active state; and generating means provided corresponding to each of said plurality of banks for receiving a signal output from a corresponding bank selecting means, said operation mode instruction signal and said bank activation signal for a corresponding bank for generating said operation mode designation signal for the corresponding bank.

3. The semiconductor memory device according to claim 1, further comprising first generating means receiving a bank address signal designating one of said plurality of banks and a bank activation instruction signal for generating a bank activation signal driving an addressed bank into the active state, wherein:

the bank driving means each include second generating means responsive to said bank activation signal for generating an array activation signal activating a corresponding bank; and the drive signal generating means each include means for determining if each of banks is in the active state or in the inactive state according to said array activation signal for each of said plurality of banks.

4. The semiconductor memory device according to claim 1, wherein:

said drive signal generating means further includes means for outputting, if a result of the determination indicates that at least two banks are in the active state, an operation mode designation signal corresponding to said operation mode instruction signal to an addressed bank according to a bank address signal supplied concurrently with said operation mode instruction signal.

5. The semiconductor memory device according to claim 1, wherein:

said operation mode instruction signal is a write mode instruction signal instructing writing of data.

6. The semiconductor memory device according to claim 1, wherein:

said operation mode instruction signal is a read mode instruction signal instructing reading of data.

7. The semiconductor memory device according to claim 1, wherein:

said operation mode instruction signal is a precharge instruction signal setting a bank in the active state into the inactive state.

8. A semiconductor memory device operating synchronously with a clock signal, comprising:

a plurality of banks that can be driven into an active state and an inactive state independently of each other;

bank selecting means receiving a bank address signal supplied synchronously with said clock signal for generating a bank designation signal designating a bank designated by the received bank address signal;

bank activating means for receiving a bank activation instruction signal supplied simultaneously with said bank address signal synchronously with said clock signal for outputting an array activation signal to a bank designated by the bank designation signal from said bank selecting means;

internal instruction signal generating means receiving an operation mode instruction signal different from said bank activation instruction signal supplied synchronously with said clock signal for generating an internal instruction signal corresponding to the received operation mode instruction signal; and a plurality of control means provided corresponding to said plurality of banks respectively, for receiving said bank designation signal from said bank selecting means and array activation signals for a corresponding and other banks from said bank activating means for supplying, when the array activation signal for the corresponding bank is in the active state and the array activation signals for the other banks are in the inactive state, an operation mode activation signal according to said internal instruction signal for the corresponding bank while neglecting the bank designation signal from said bank selecting means.

9. The semiconductor memory device according to claim 8, wherein:

said operation mode instruction signal is a write mode instruction signal instructing writing of data.

10. The semiconductor memory device according to claim 8, wherein:

said operation mode instruction signal is a read mode instruction signal instructing reading of data.

11. The semiconductor memory device according to claim 8, wherein:

said operation mode instruction signal is a precharge instruction signal for setting a bank in the active state into the inactive state.

* * * * *